United States Patent
Hill

(10) Patent No.: US 9,030,297 B2
(45) Date of Patent: *May 12, 2015

(54) RFID TAGS

(75) Inventor: Nicholas Patrick Roland Hill, Cambridge (GB)

(73) Assignee: Cambridge Resonant Technologies Ltd., Cambridge (GB)

( * ) Notice: Subject to any disclaimer, the term of this patent is extended or adjusted under 35 U.S.C. 154(b) by 993 days.

This patent is subject to a terminal disclaimer.

(21) Appl. No.: 12/531,070

(22) PCT Filed: Feb. 20, 2008

(86) PCT No.: PCT/GB2008/050109
§ 371 (c)(1),
(2), (4) Date: Sep. 14, 2009

(87) PCT Pub. No.: WO2008/110833
PCT Pub. Date: Sep. 18, 2008

(65) Prior Publication Data
US 2010/0097187 A1    Apr. 22, 2010

(30) Foreign Application Priority Data

Mar. 14, 2007  (GB) .................................. 0704890.3
May 18, 2007  (GB) .................................. 0709576.3

(51) Int. Cl.
*G06K 19/07*  (2006.01)
*H03C 1/54*   (2006.01)

(52) U.S. Cl.
CPC ........ *G06K 19/0723* (2013.01); *G06K 19/0707* (2013.01); *G06K 19/0712* (2013.01); *G06K 19/0726* (2013.01); *H03C 1/547* (2013.01)

(58) Field of Classification Search
USPC ......................................................... 340/10.1
See application file for complete search history.

(56) References Cited

U.S. PATENT DOCUMENTS 5,283,529 A  2/1994  Meier
5,621,396 A  4/1997  Flaxl
(Continued)

FOREIGN PATENT DOCUMENTS

EP  0386718  9/1990
EP  1233371  8/2002
(Continued)

OTHER PUBLICATIONS

International Search Report dated Jun. 23, 2008 for related international patent application PCT/GB2008/050109 (3 pgs).

*Primary Examiner* — Brian Zimmerman
*Assistant Examiner* — Cal Eustaquio
(74) *Attorney, Agent, or Firm* — Billion & Armitage; Michael A. Collins

(57) ABSTRACT

We describe RFID tags that incorporate a nonlinear resonator that self-adapts to the driving frequency of a reader. More particularly we describe an RF tag for sending data to a tag reader by modulating energy drawn from an RF field of said tag reader, the tag comprising: an antenna; a resonant circuit coupled to said antenna to resonate at a frequency of said RF field; a local power store to store power extracted from said RF field; a modulation system to modulate one or both of the resonance amplitude and a relative phase of a signal in said resonant circuit with respect to said RF field; and a feedback circuit coupled to said resonant circuit and to said local power store to control one or both of said resonance amplitude and said relative phase to control transients in said resonance amplitude caused by said modulation.

43 Claims, 31 Drawing Sheets

(56) References Cited

U.S. PATENT DOCUMENTS

| | | |
|---|---|---|
| 6,229,443 B1 * | 5/2001 | Roesner ............... 340/572.1 |
| 6,559,754 B1 * | 5/2003 | Amtmann ............... 340/10.51 |
| 7,498,948 B1 * | 3/2009 | Gudeman et al. ......... 340/572.8 |
| 2002/0119751 A1 * | 8/2002 | Baumann et al. ............ 455/41 |
| 2003/0006880 A1 | 1/2003 | Zimmer |
| 2004/0135673 A1 | 7/2004 | Oberhuber et al. |
| 2005/0134234 A1 * | 6/2005 | Kaiser .................... 320/166 |
| 2008/0012700 A1 | 1/2008 | Turban et al. |

FOREIGN PATENT DOCUMENTS

| | | |
|---|---|---|
| EP | 1378993 | 1/2004 |
| WO | WO2005101303 | 10/2005 |
| WO | PCT/GB2006050436 | 12/2006 |
| WO | PCT/GB2006050440 | 12/2006 |

* cited by examiner

RFID TAGS

The present application is a nationalization of PCTPCT/GB2008/050109, filed 20 Feb. 2008, published as WO 2008/110833, which claims priority to UK application no. 0704890.3, filed 14 Mar. 2007, and UK application no. 0709576.3, filed 18 May 2007, which are all incorporated by reference herein for any purpose.

FIELD OF INVENTION

Embodiments of the invention relate to the field of RFID tags, particularly RFID tags that incorporate a nonlinear resonator that self-adapts to the driving frequency of a reader.

BACKGROUND TO THE INVENTION

Radio frequency identification (RFID) generally employs resonance in order to increase the efficiency of energy transfer from the reader to the tag. This is achieved through the resonant recycling of energy that results in voltage step up in the tag when subject to the reader powering field. In order to achieve the required minimum voltage for the tag to operate, a high Q resonance in the tag is desirable. However, two constraints mean that the tag Q is limited to low values of order 10:
1) As the tag Q increases the width of the resonance drops proportionally. The high levels of step up corresponding to the high Q are only achieved over a very narrow frequency band. This makes the system susceptible to severe degradation due to environmental detuning or variation at manufacture.
2) The system is also required to communicate once the tag is powered. A high tag Q does not give sufficient bandwidth for communication and the amplitude of any load modulation, when registered at the reader, is attenuated.

Some of these limitations are addressed in PCT/GB2006/050436 where a new resonant circuit is disclosed comprising a self-adaptive resonator that may be operated over a designed band of frequencies, independent of the level of loss. In embodiments this is achieved through the use of an antenna and two capacitive paths that are coupled into the resonance with a variable duty cycle; the duty cycle is controlled by the waveform amplitude and the gate voltage on a MOSFET. One application of this circuit is in a tag where the induced voltage is used to control the mosfet gate voltage and ramp up the amplitude in tag. This arrangement can achieve high levels of voltage step up corresponding to low loss in the antenna resonance, without the drawbacks of a narrow single resonance frequency. In effect the tag has an auto tuning behaviour to the stimulus frequency, provided it is within a designed frequency band. Furthermore, the system may be completely passive without the requirement for a separate power source to operate the tuning circuit. It therefore has application in RFID with potential benefits including:
1) Extending the range over which the tag may be powered.
2) Allowing the use of a smaller tag antenna for the same range
3) Making the tag more tolerant to environmental detuning or variation at manufacture.

Once the tag is powered it is then required to communicate with the reader through load modulation. A method is disclosed in PCT/GB2006/050440 whereby feedback is employed in a reader to reduce the variation in resonance amplitude in response to tag load modulation. This has the effect of increasing the speed of response in the reader to variation on the modulation timescale, while retaining the low loss behaviour of the slowly varying powering field. The result is a low power reader, also capable of achieving excellent range.

To date there is no disclosure outlining how to achieve this same separation of dynamics in a tag whereby high Q operation is achieved for a slowly varying powering field together with a fast response on the timescale of the communication modulation. This is needed in order to carry out the required functions of tag reading and tag programming.

SUMMARY OF THE INVENTION

The invention is set forth in the independent claims.

These embodiments describe a method by which the self-adaptive resonator may be employed in an RFID tag. The resonator is first used to derive power from a field generated by a RFID reader. The power is then used to modify the behaviour of the tag in order to achieve communication from the tag to the reader and/or communication from the reader to the tag.

According to an aspect of the embodiments, the self-adaptive resonator is employed in a half duplex tag, where the powering and communication cycles are separated in time. The self-adaptive resonator is used to derive power from the reader field, charging up a local power store. Once powered the tag may use the self-adaptive resonator as a transmitter or receiver to communicate with the reader. Alternatively, The tag switches off the self-adaptive resonator and switches on a conventional linear resonator that is used to communicate to the reader. In this manner the tag benefits from the auto-tune behaviour of the resonator in deriving power, together with increased range if the antenna Q is relatively high. The tag may optionally include a tuning circuit that is applied to the linear resonator once sufficient power is obtained.

According to another aspect of the embodiments, the self-adaptive resonator is employed in a full duplex tag to derive power from the reader field. Once sufficient power is obtained, a linear resonator is switched in place of the self-adaptive resonator. Also a tuning circuit may be powered from the initial stored power in order to match the frequency of the linear resonator to the powering field. In this manner the system may auto-tune and operate in the presence of a detuning environment or with significant variation in component values at manufacture.

According to another aspect of the embodiments, the self-adaptive resonator is used with a high Q such that the range of the system over which the tag may be powered is extended. Once powered, the tag communicates back to the reader by modulating the self-adaptive resonator, for example by modulating the voltage on the gate of the resonance MOSFET. In order to achieve a fast data rate the modulation of the tag current is made small compared to the steady state pickup current. In this manner the transition time between the two levels in the tag may be reduced. By keeping the tag current at a continually high level, the power that may be derived from the reader field is kept high and the range may be increased. As long as the reader has sufficient noise floor to register the modulation, this system combines the long range implied by the high Q, with a fast response required for communication. In fact, this method need not be limited to the self-adaptive resonator and may be applied to a conventional linear resonator with high Q.

According to a another aspect of the embodiments, the self-adaptive resonator is used with a high Q to derive power from the reader system. Once powered, a fraction of the power is used to operate feedback, preferably negative feedback, to reduce the transient amplitude variation of the resonance in the tag and speed up the response to changes in either the reader field or tag resonance controls. Operation of the feedback may include a phase lock loop that is locked to the resonance during the powering cycle. The feedback may be implemented with an analogue circuit or under digital control.

In the embodiments of negative feedback, the tag retains a high Q behaviour for the slowly varying powering field. However the feedback means that transient changes in the tag are quickly manifest in a modified tag antenna current, which may be registered as load modulation in the reader.

Further examples of tag modulation for tag to reader communication include:
1) Modulation of the phase of the resonance in the tag. This may be achieved through the timing of the feedback stimulus to the tag resonance.
2) Modulation of the feedback stimulus width applied to the resonance in the tag to modify the resonance amplitude
3) Modulation of the energy dissipated in the tag through a resistive element in the tag. In this manner the tag amplitude stays approximately constant, but the power derived from the reader field is modified.
4) Any other combination of the amplitude and phase of the tag resonance brought about by changes to the tag resonance controls.

When the reader communicates to the tag through the amplitude of the powering field, the negative feedback means that the tag responds quickly. The amplitude of the field may be registered through different measurements, including:
1) The tag resonance amplitude.
2) The level of feedback in the tag.
3) The amplitude of the power supply voltage.
4) The energy being dissipated in the tag.

The use of feedback and/or a local energy store to assist the tag transitions therefore enables high Q operation and extended range for the powering field, whilst also a fast response for tag to reader communication and/or reader to tag communication. Although the embodiments focus on implementation of these functions with the self-adaptive resonator, they may be equally well applied to a conventional linear resonator of high Q.

According to another aspect of the invention, the tag locally stores energy from the reader field that is subsequently used to augment the reader field when transitioning between levels in the tag. This may be used to achieve a faster response than simply allowing the antenna to ramp slowly in amplitude in response to the powering field. In this manner a high tag current may be achieved quickly, and this fast change in state allows high levels of power to be derived from the reader field quicker; this is because the energy derived from the reader is directly related to the amplitude and phase of the current in the tag. The store of energy may take place over a number of cycles, or recovered from a single transition from a high amplitude to a low amplitude state. The energy store may be in the form of charge on a capacitor and/or current in an inductor. The tag may include means to reduce the amplitude of transients generated during the energy recovery process.

According to another aspect of the invention the use of the self-adaptive resonator, possibly in combination with a tuning circuit once the tag is powered, not only improves the tolerance to detuning of the tag but also may allow use of the same tag with multiple frequencies. Examples include a low frequency tag operating at the two common low frequencies of 125 kHz and 134 kHz or an ultra high frequency tag operating over the band 860 MHz to 960 MHz. Here the self-adaptive resonator is able to power up the tag across the range of required frequencies, then operating the same resonator or a conventional resonator with a powered tuning circuit for subsequent communication.

In embodiments, two-way communication with a reader is described, including tag to reader communication and reader to tag communication. Strictly speaking, the reader is behaving as a writer when it transmits data to the tag, but the term reader is used here to encompass any reader and/or writer combination.

BRIEF DESCRIPTION OF THE DRAWINGS

FIG. 2A is a waveform of the resonance voltage in the tag as a function of time when a reader powering field is turned on.

FIG. 11A is the resonance voltage of a tag in the presence of a reader field, where the amplitude is ramped up and then the feedback circuit switched on.

FIG. 12A is a waveform of the transient voltage at the p-type source connection when the feedback is switched on.

DETAILED DESCRIPTION OF EMBODIMENTS

The following description of a resonant circuit responsive to a wide frequency range is merely exemplary in nature and is in no way intended to limit the invention or its applications or uses. Those skilled in the art will recognise that in addition to the field of RED it may equally well be applied to any area requiring the generation or detection of modulation with a resonant antenna.

Figure 1:
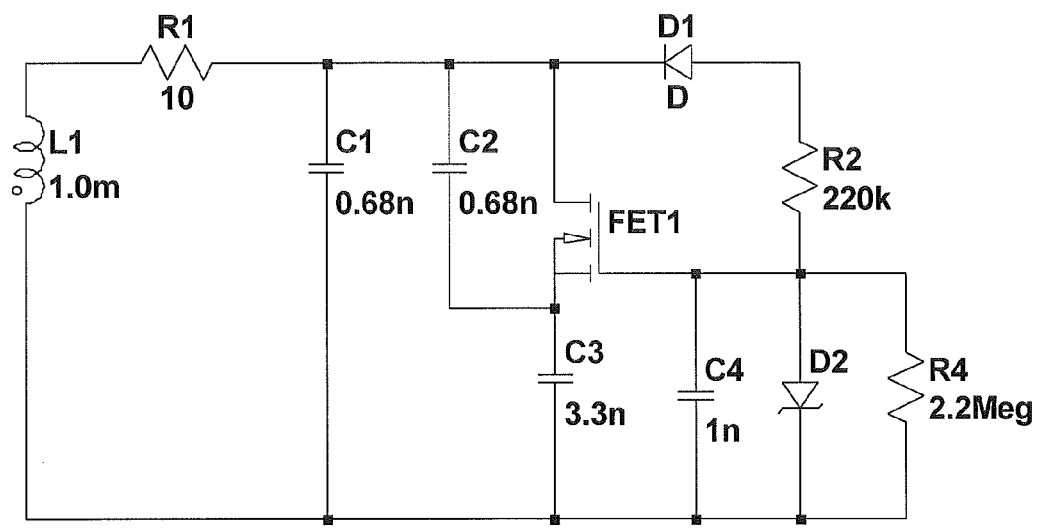
FIG. 1 is a schematic of a tag incorporating a self-adaptive resonator with an external bias network.

FIG. 1 shows a schematic of the self-adaptive resonator applied to a tag. The resonator is based on an antenna with 1 mH inductance and 10Ω resistance, giving a Q of approximately 80. This antenna is in parallel with a network of three capacitors and a MOSFET that together form the self-adaptive resonator. The operation of this circuit is illustrated by the waveforms in FIG. 2.

Figure 2A:
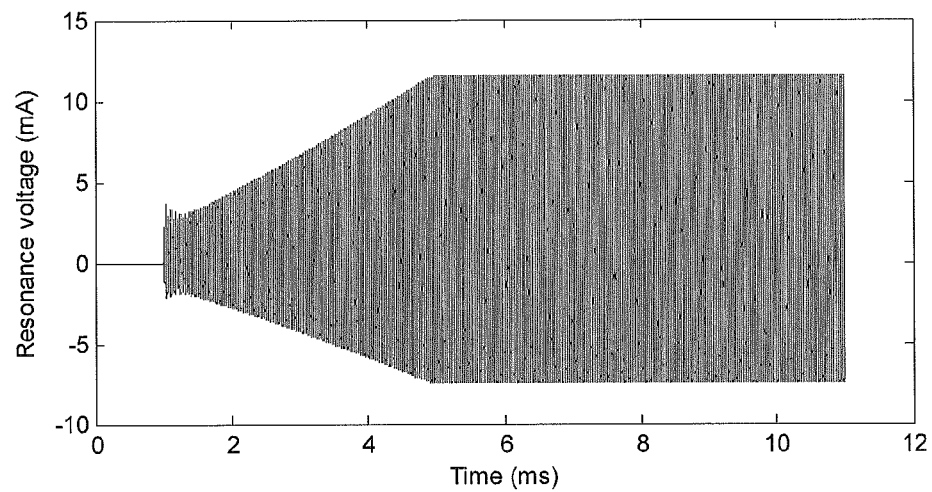
Figure 2B:
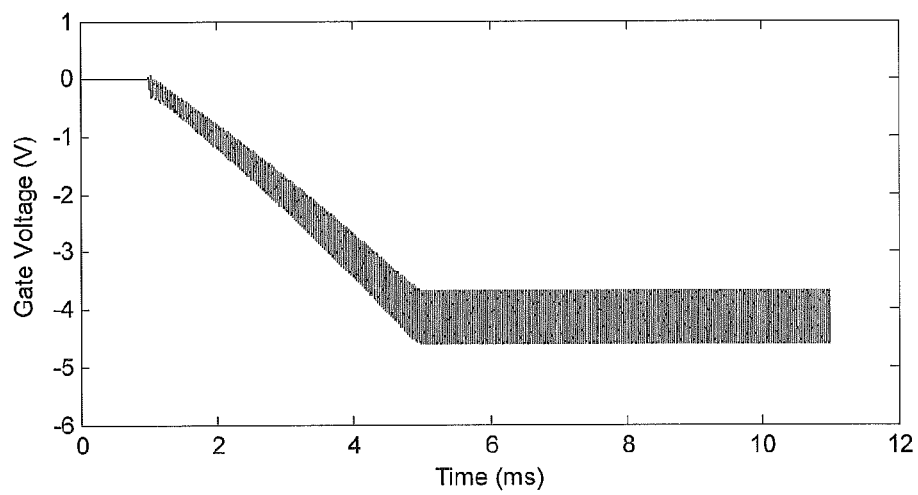
FIG. 2B is the corresponding waveform of the MOSFET gate voltage.

FIG. 2A shows the resonance voltage in the tag in response to a stimulus field turned on at 1 ms. When the field is first turned on the MOSFET gate voltage is at 0V, as shown in FIG. 2B, and the resonator first settles to a relatively low amplitude. This amplitude sets the duty cycle of the MOSFET conduction to the appropriate value to match the resonant circuit to the 125 kHz stimulus field.

Some of the resonance voltage is bled off via diode D1 into a bias network that gradually lowers the MOSFET gate voltage to negative potential. The limit is set by the 5V zener diode D2. As the gate voltage is lowered, the resonance ramps up in amplitude to 12V maximum voltage. In this manner a high Q tag may auto-tune to a stimulus field and derive a high power level.

Figure 3:
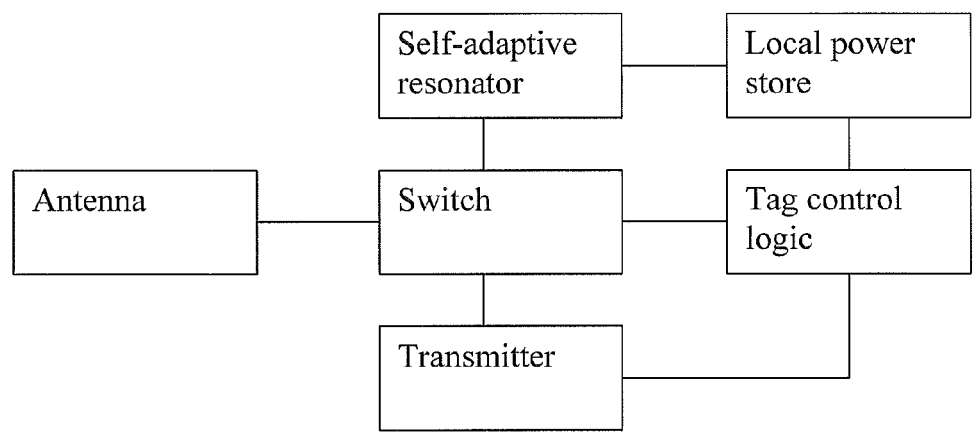
FIG. 3 is a block diagram of an embodiment of a half-duplex tag.

FIG. 3 shows a block diagram of an embodiment of a half-duplex passive RFID tag incorporating the self-adaptive resonator. The default state at zero power of the switch is to connect the antenna to the capacitive network, forming the self-adaptive resonator. When the powering field from the reader is switched on the self-adaptive resonator draws power, charging up the local power store and powering the tag control logic. When fully charged the self-adaptive resonator is switched off and a conventional transmitter is coupled in, possibly containing the components to form a standard linear resonator. The voltage rails generated from the powering phase, both positive and negative, provide sufficient headroom to completely switch the connection between the self-adaptive resonator and the transmitter. The transmitter may optionally include a tuning circuit that adapts to the local environment or manufacturing variation. However, no such tuning circuit is required for the powering phase (or would be possible, given the lack of power at this stage) since the self-adaptive resonator takes care of this task. In this manner the benefits of a high Q antenna for enhanced range and/or the tolerance to detuning of the self-adaptive resonator provide an improved half-duplex passive RFID tag.

Figure 4:
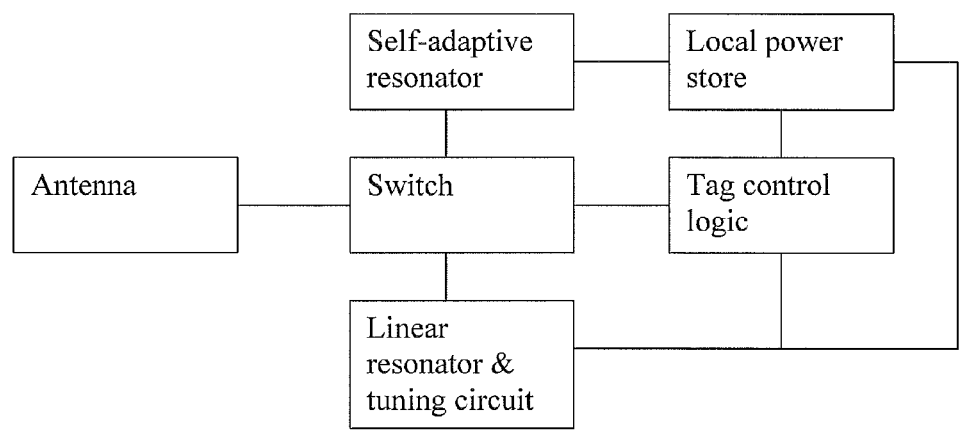
FIG. 4 is a block diagram of an embodiment of a full-duplex tag.

FIG. 4 shows a block diagram of an embodiment of a full-duplex passive RFID tag incorporating the self-adaptive resonator. This setup is similar to FIG. 3, where the self-adaptive resonator is used to auto-tune to the powering field. When the tag has sufficient initial charge the switch is changed to connect the antenna to a capacitor as a standard linear resonator. There is also the option to power a tuning circuit that enables the linear resonator to match the reader frequency in the presence of environmental detuning or variation at manufacture. The linear resonator is used in a standard load modulation configuration to transmit information from the tag to the reader. Also the amplitude of the linear resonator is used to register data transmitted from the reader to the tag.

The Q of the linear resonator may be similar to that of a standard tag in order to achieve sufficient communication bandwidth. If this is combined with a self-adaptive resonator with high Q then the power derived from the field may drop once the linear resonator is switched in and the communication takes place. The initial powering of the tag may derive sufficient power to support the operation of the tag over the whole communication cycle, in which case the range of the tag is extended. Alternatively, the linear resonator may set the power range, however the use of the self-adaptive resonance provides detuning tolerance of the system through the use of a tuning circuit once initially powered up.

The Q of the linear resonator may be higher than a standard tag, in which case the power derived even in the communication cycle may exceed the standard tag, extending the working range. The powered tuning circuit ensures that the high Q of the tag does not detune from the reader. The reader may be sensitive to the transient changes in the tag, even with a relatively slow transition as a result of the high Q. An alternative solution to a fast transition of a high Q resonator is to reduce the amplitude of the load modulation. In this case the response time of the tag can be improved. As long as the reader has sufficient noise floor to pick up this transition, good communication will still result. This setup has the advantage that the tag antenna current is kept high, drawing high levels of power from the reader field.

Figure 5:
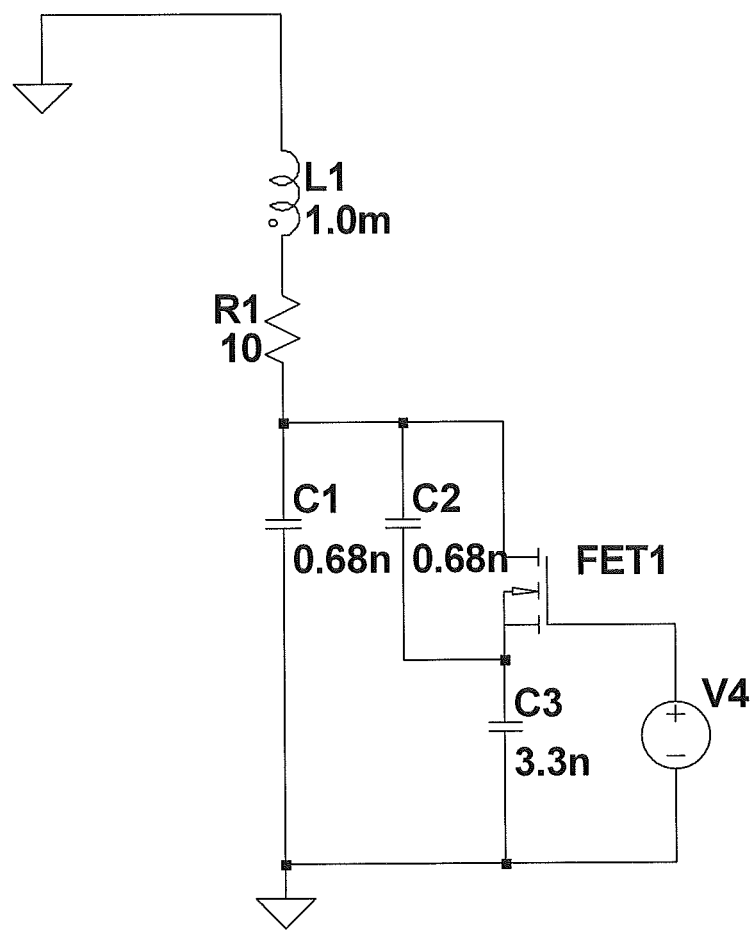
FIG. 5 is a schematic of a tag with the bias network replaced by a general voltage source.

FIG. 5 shows a schematic of a self-adaptive resonator, similar to FIG. 1 but with the bias network replaced with a voltage source. It has been shown how the bias network can be used to ramp the amplitude of the resonator and derive high levels of power from the reader field. Subsequent figures show the behaviour of the tag under arbitrary gate control voltage, which may be obtained with a bias network or via external control from the tag logic system once power is derived.

Figure 6A:
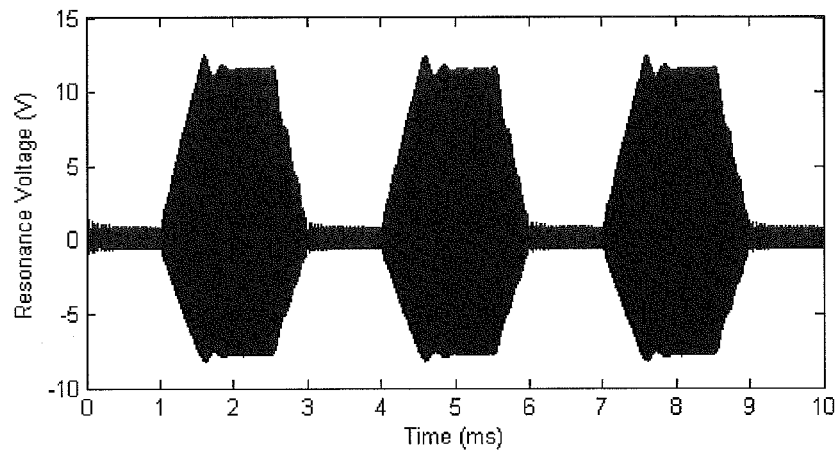
FIG. 6A shows the resonance voltage of a tag in the presence of a reader field, where the MOSFET gate voltage is modulated with a slow transition.
Figure 6B:
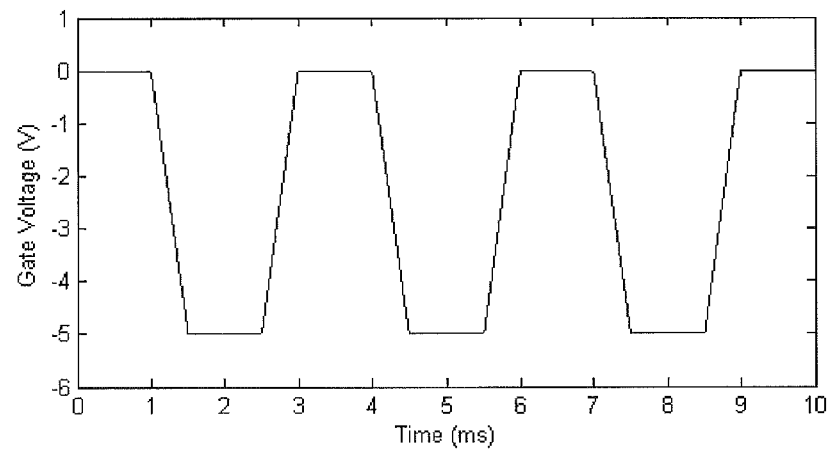
FIG. 6B is the corresponding gate voltage.

FIG. 6A shows the behaviour of the resonance voltage when the gate voltage is modulated as shown in FIG. 6B. The gate modulation is slow, taking 0.5 ms to complete a transition. The tag antenna voltage is only able to change relatively slowly due to the high antenna Q, however the slow ramp rate of the gate voltage means that the resonator follows the modulation. This rate of modulation may not be sufficient to support communication from the tag to the reader at the required rate.

Figure 7A:
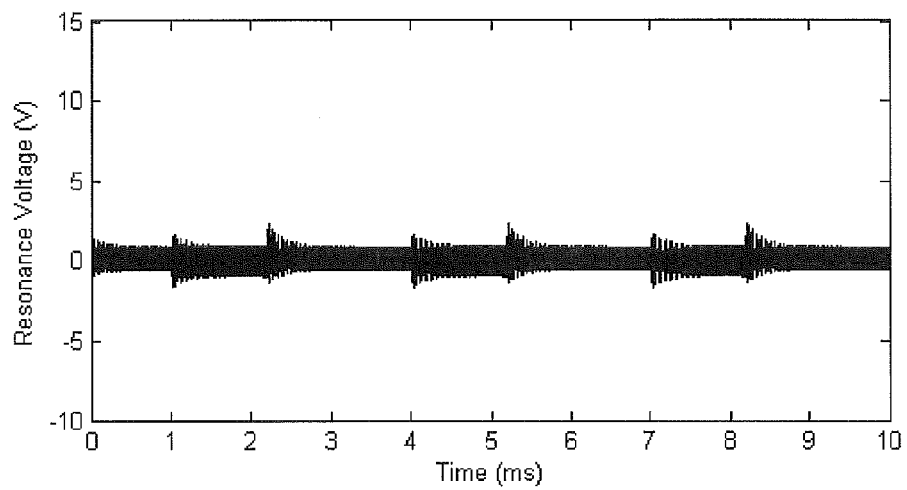
FIG. 7A shows the resonance voltage of a tag in the presence of a reader field, where the MOSFET gate voltage is modulated with a fast transition.
Figure 7B:
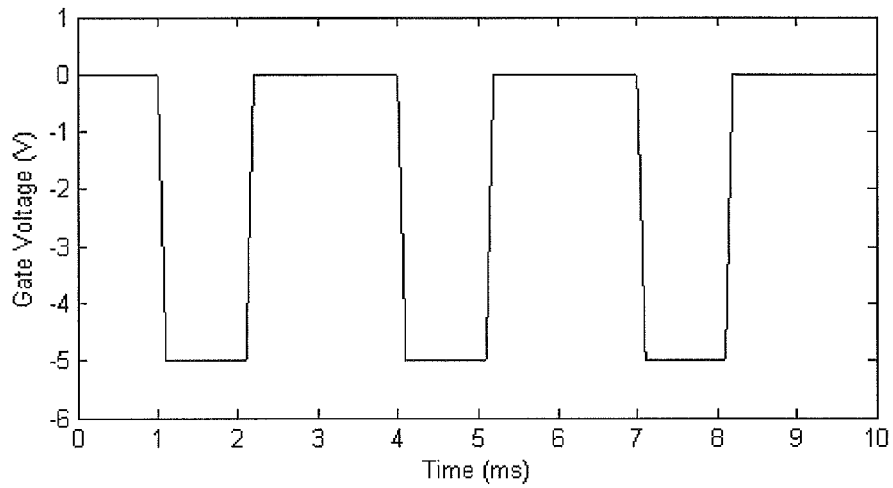
FIG. 7B is the corresponding gate voltage.

FIG. 7 shows the same graphs as FIG. 6 but with the transition speed of the modulation increased. In this situation, the resonator is unable to follow the modulation, demonstrating a limit on the rate at which modulation may take place.

Figure 8A:
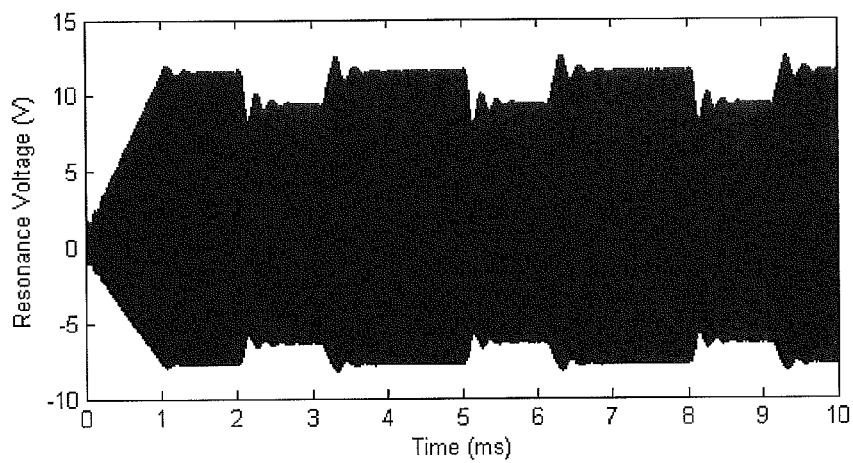
FIG. 8A shows the resonance voltage of a tag in the presence of a reader field, where the MOSFET gate voltage is modulated with a low amplitude.
Figure 8B:
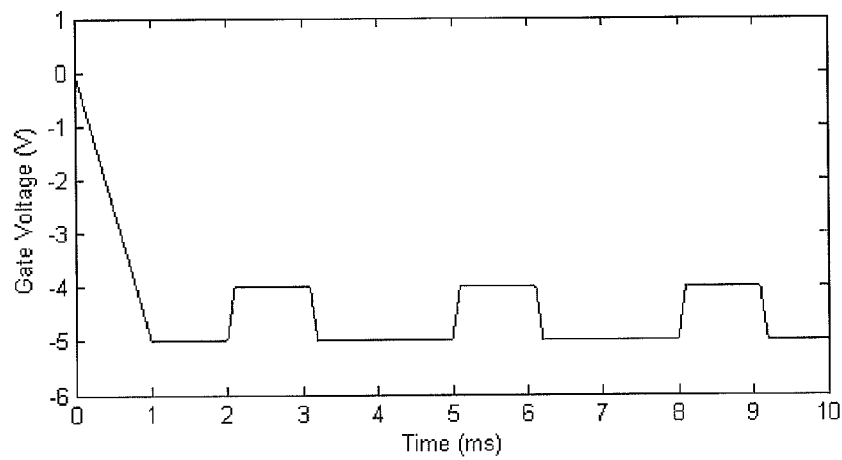
FIG. 8B is the corresponding gate voltage.

FIG. 8 shows same graphs as FIG. 7 but with the amplitude of the modulation reduced from 5V to 1V. The resonator is now able to respond to the modulation quickly, achieving a high data rate. The tag antenna current stays high throughout the modulation, which will maintain the power derived from the reader field. There are some transients resulting from the modulation evident as amplitude oscillations after the transition. These may not be a problem in the reader interpretation of the communication signal as they may be sufficiently low in amplitude relative to the overall amplitude change. In this manner, a reduction in the modulation amplitude may allow a high Q self-adaptive resonator to support the required data rate between the tag and the reader. The criterion for the tag being able to follow the modulation may be that the change to the resonator controls still leaves voltage waveform in the resonator that are sufficient to turn on the resonance MOSFET for a portion of the full duty cycle. In this manner the adaptive resonator stays 'in lock' with the reader field, adapting to the new level set by the resonance controls.

The modulation of the tag amplitude is preferably less than 50%, and more preferably less than 25%. Alternatively the modulation may be phase modulation. In this case the modulation is preferably less than 180° and more preferably less than 90°.

Figure 9:
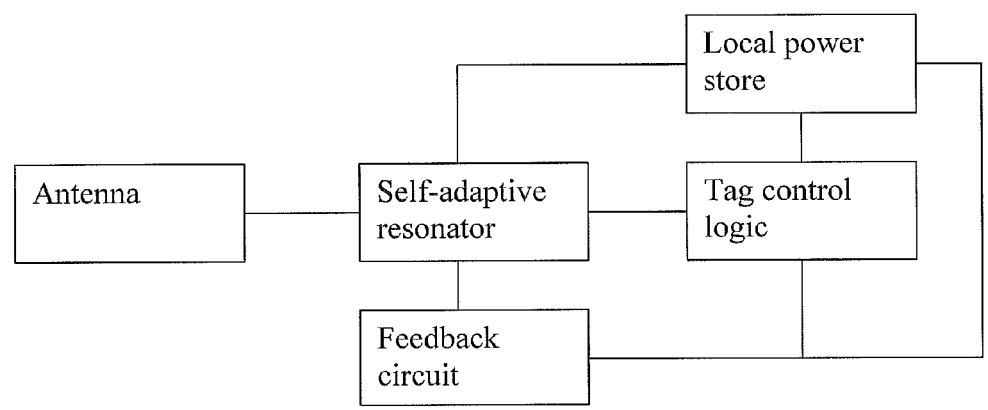
FIG. 9 is a block diagram of an embodiment of a tag incorporating the self-adaptive resonator and a feedback circuit.

FIG. 9 shows a block diagram of an embodiment of the tag where the self-adaptive resonator is used in combination with a feedback circuit to reduce the amplitude of transient changes in the resonance voltage. Initially the negative feedback circuit may be turned off with the self-adaptive resonator deriving power from the reader field. Once the tag has derived sufficient power the feedback circuit may be turned on, with a proportion of the power from the reader going into the operation of the feedback. With the feedback operational the speed of response of the tag may be fast on the timescale of the communication while still retaining the high Q behaviour required for improved range for the slowly varying powering field.

Figure 10:
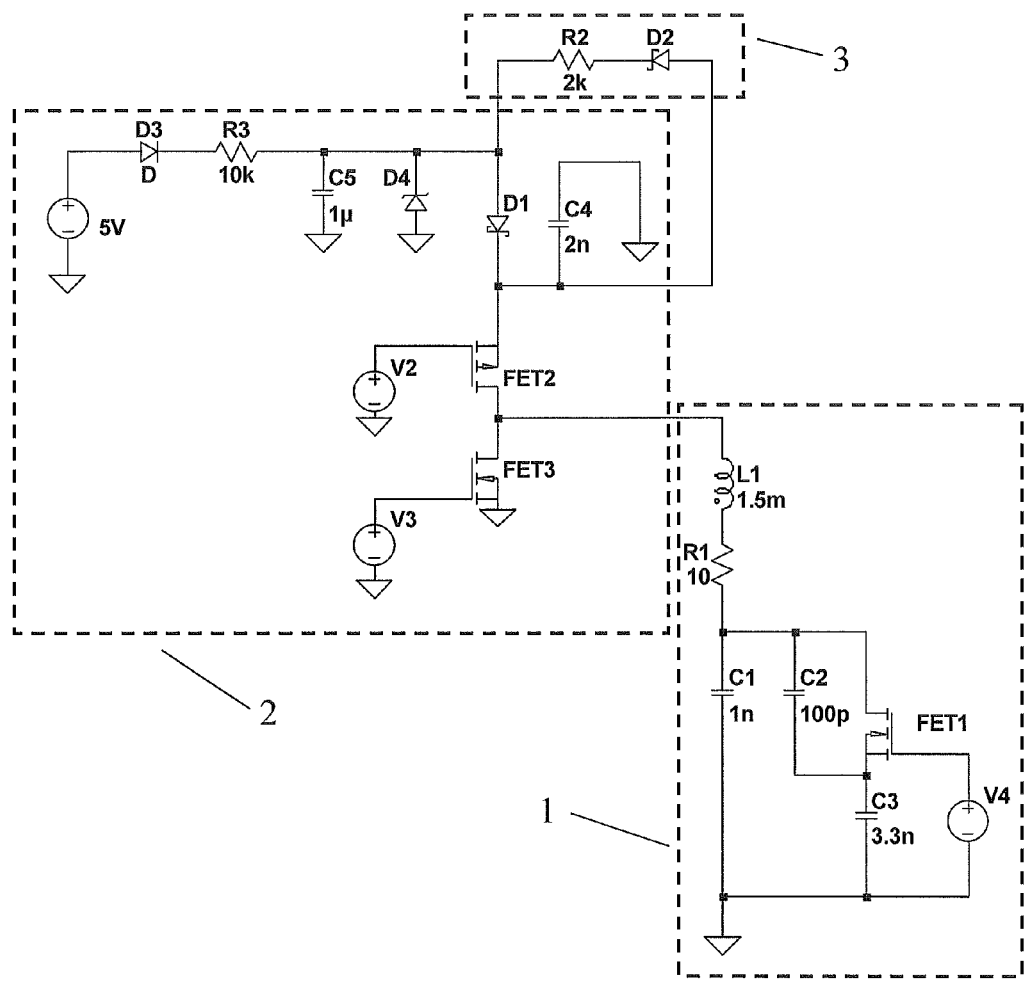
FIG. 10 is schematic of an embodiment of a tag incorporating the self-adaptive resonator and a feedback circuit.

FIG. 10 shows a schematic of a tag implementing the feedback circuit comprising the self-adaptive resonator 1, feedback circuit 2, and feedback powering branch 3. The operation of the circuit is now described with reference to the graphs in FIGS. 11-17.

Figure 11A:
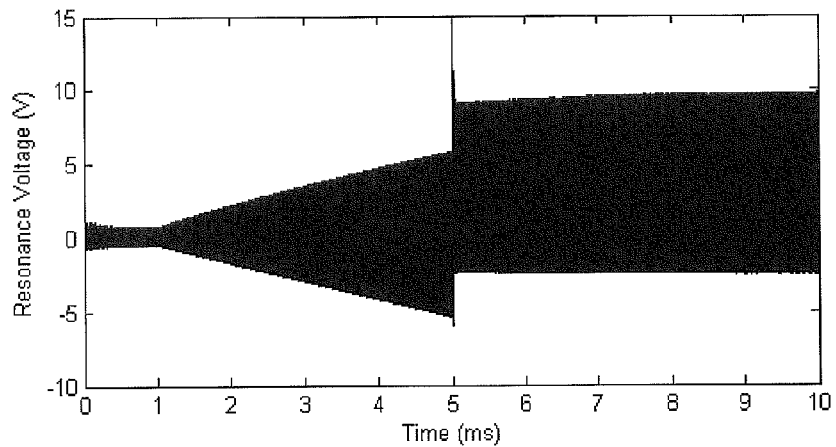
Figure 11B:
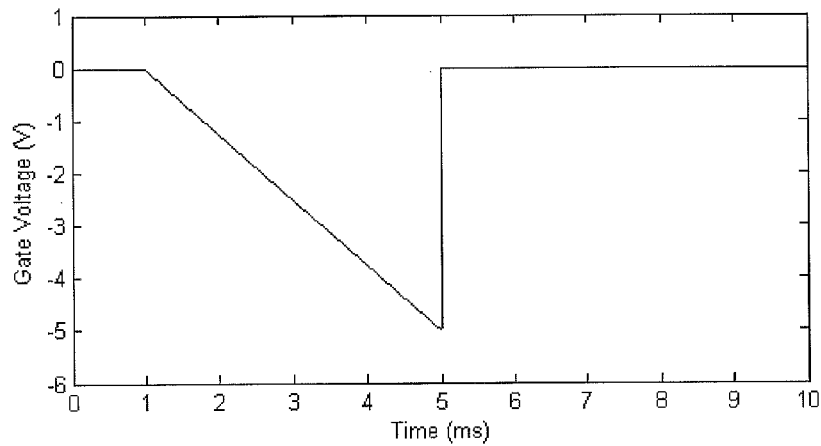
FIG. 11B is the corresponding MOSFET gate voltage.

FIG. 11A shows the resonance voltage as a function of time. The reader field is turned on at 0 ms and the resonance amplitude starts off at low amplitude. The resonance amplitude gradually increases from 1 ms to 5 ms as the gate voltage (shown in FIG. 11B) is reduced from 0V to −5V. This would be implemented with a bias circuit similar to that shown in FIG. 1. At 5 ms the resonance amplitude is sufficiently high to derive a high level of power from the reader field; this may be continued for an arbitrarily long period in order to charge up the local power store on the tag.

At 5 ms the gate voltage is returned to zero and the feedback circuit is turned on. This is achieved by modulating the MOSFET pair FET2 and FET3 with a square wave pulse 3 us wide i.e. the p-type is conducting for 3 us and the n-type for the remaining 5 us of the 125 kHz cycle. Note that the n-type MOSFET may be a depletion mode device to ensure that it is conducting in the initial case where the tag has no power store. The gate voltages to the two MOSFETs are chosen to ensure the switch between either device conducting. The timing of the 125 kHz signal to the MOSFETs may be derived from a phase lock loop that is locked to the resonance amplitude during the initial powering cycle when the feedback is turned off. The phase of the square wave is chosen such that the resulting resonance still draws significant power from the reader antenna. The phase lock loop may be continuously adjusted with respect to the resonance waveform. With the feedback turned on the resonance amplitude jumps to a new level.

Figure 12A:
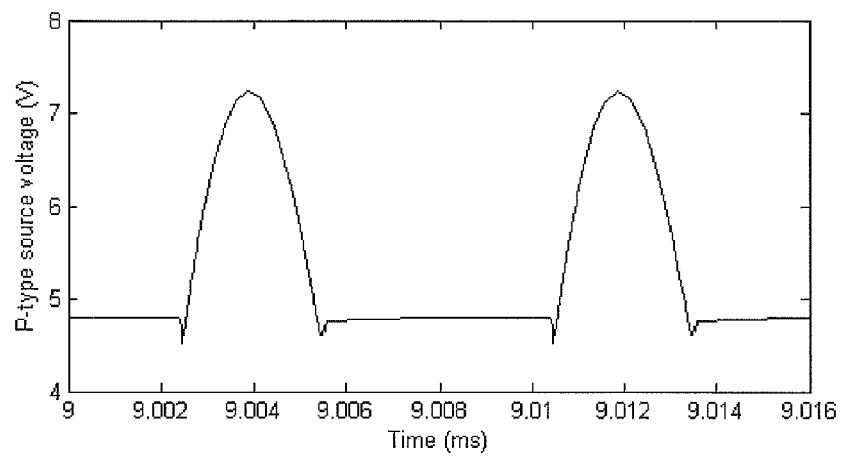
Figure 12B:
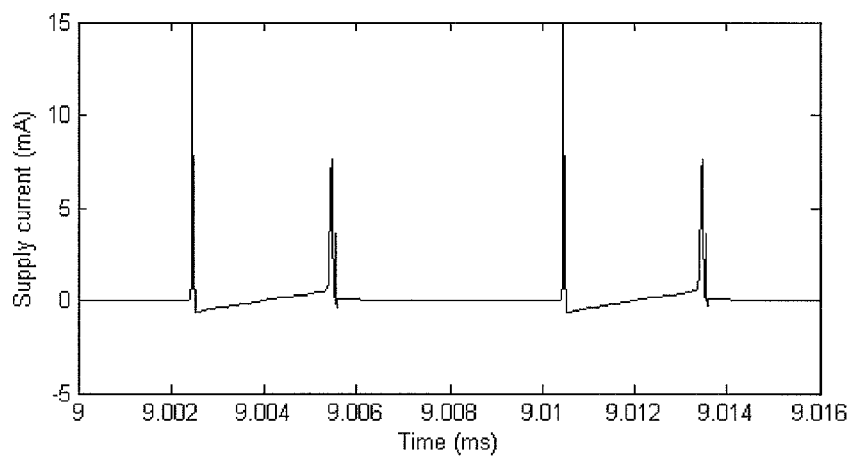
FIG. 12B is the corresponding current supplied to the resonance.

FIG. 12 shows two waveforms in the feedback circuit. The transient voltage at the p-type MOSFET source terminal is shown in FIG. 12A. Most of the current is transient, flowing into and out of C4, and results in the overall shape of the source potential. However some current is supplied by the feedback circuit into the resonance to maintain the amplitude. These are the current spikes evident in FIG. 12B. This supply of current into the resonance is required for operation of the feedback. The branch 3 connects C4 via a diode and resistor to the feedback supply capacitor C5. This draws current from the resonance in to the feedback supply, powering the feedback to 5V.

This action of drawing power from the resonance only to re-introduce it from the feedback circuit will have some inefficiencies, leading to increased loss in the system. However, provided the reader field is large enough to support this added loss then the feedback is self powering. In effect the increased loss is used to operate the feedback, increasing the speed of the response of the tag, as will be demonstrated later.

Figure 13:
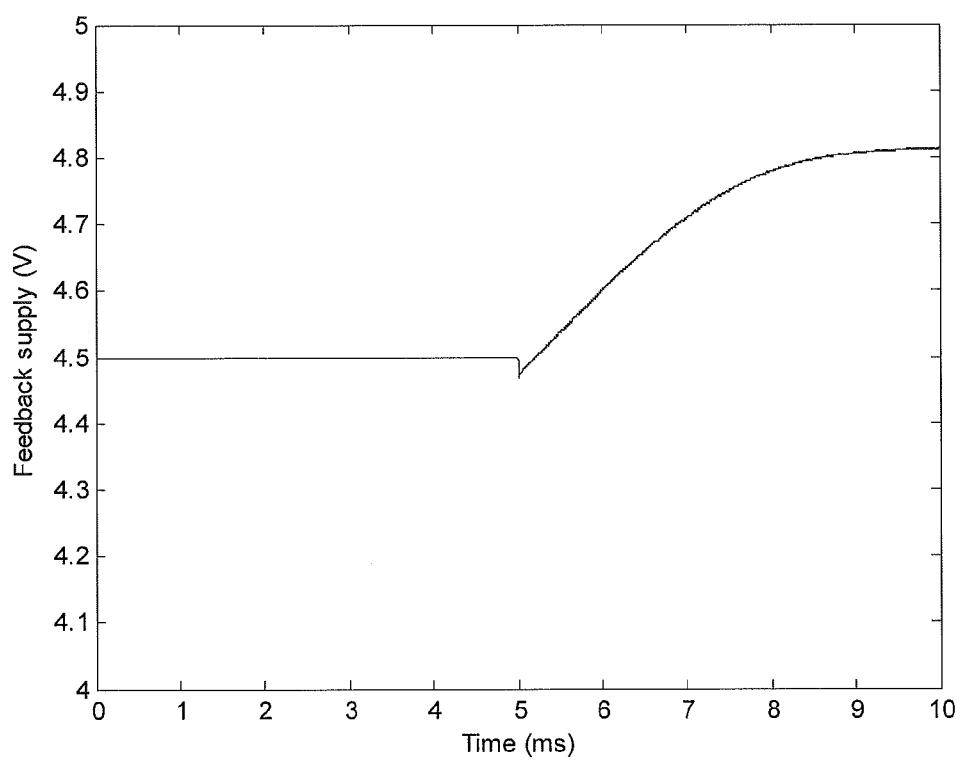
FIG. 13 is a waveform showing the feedback supply voltage.

FIG. 13 shows the potential of the feedback supply voltage on C4. Initially this is at 4.5V, which is set by the external 5V supply through diode D3. The external supply may be derived from the local power store as a result of the initial powering cycle. Once the feedback is turned on the feedback supply increases closer to 5V as power is drawn from the resonance. This cuts off the external 5V supply through D3, and the feedback becomes powered from the resonance only. The feedback voltage is limited by the 5V zener diode D4.

In this manner the self-adaptive resonance may be operated for an initial powering cycle, then switching in a feedback circuit to reduce transient amplitude variations in the resonance voltage. Once operational the feedback circuit is powered by a fraction of the power derived from the reader field. The system retains its high Q properties for the slowly varying powering field, but now has a fast response to transient changes in the reader or tag, allowing increased communication rates. The results of tag modulation are now described.

Figure 14A:
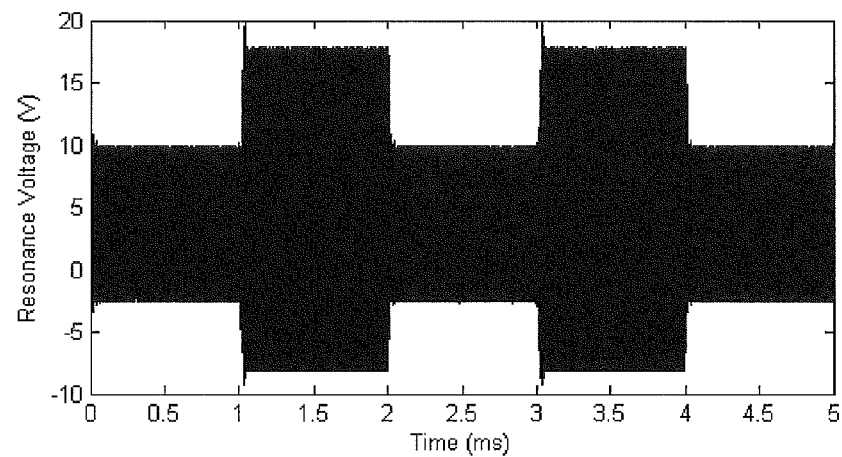
FIG. 14A is a waveform showing the resonance voltage in a tag with the feedback circuit switched on and the MOSFET gate voltage modulated.
Figure 14B:
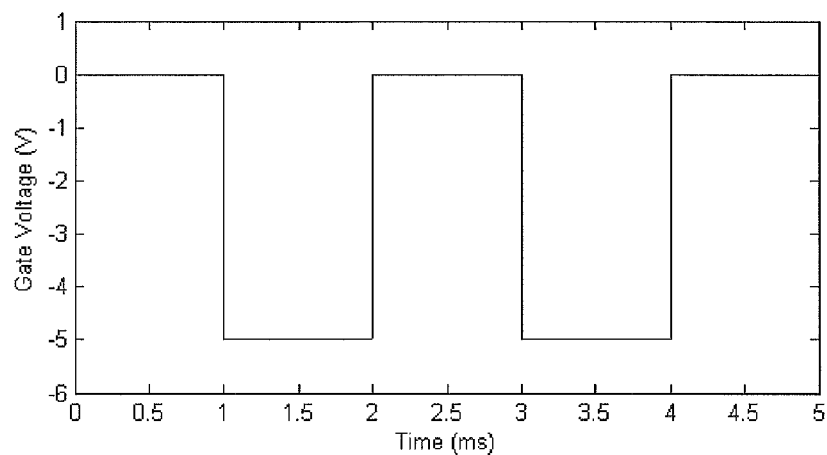
FIG. 14B is the corresponding gate voltage.
Figure 15A:
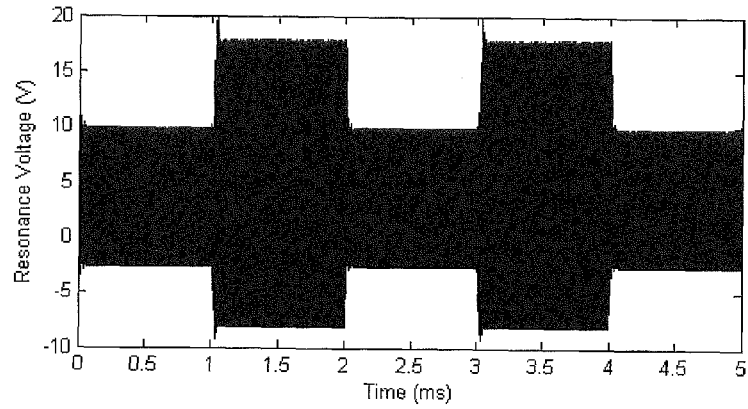
FIG. 15A is a waveform showing the resonance voltage in a tag with the feedback circuit switched on and the MOSFET gate voltage modulated.
Figure 15B:
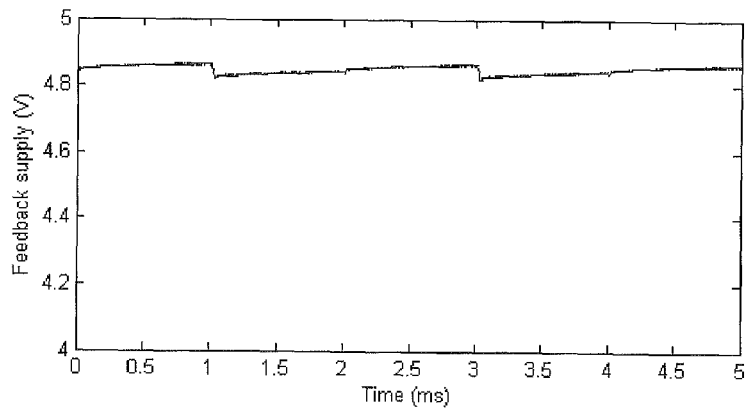
FIG. 15B is the corresponding feedback supply voltage.

FIG. 14A shows the resonance voltage in the tag as a result of the gate voltage modulation shown in FIG. 14B. The modulation is between 0V and −5V, leading to resonance voltage variation from 10V to 18V. It is clear from the waveform in FIG. 14A that the speed of response of the tag has been greatly increased over the zero-feedback case. FIG. 15A shows the same resonance voltage together with the feedback supply voltage. This voltage is still sufficiently high to ensure that diode D3 remains cut off and the feedback is still self-powered from the resonance. When the resonance voltage transitions from 10V amplitude to 18V there is a transient drop in the feedback supply. Here power has been drawn from the feedback supply to augment the power available from the reader field and ensure a fast transition of the resonance. The voltage level on the feedback supply recovers over the duration of each amplitude level. There is also a much smaller positive jump in the feedback supply for the opposite transition from 18V amplitude to 10V amplitude. Here some energy from the resonance is recycled into the feedback supply, rather than being completely lost as heat.

Figure 16A:
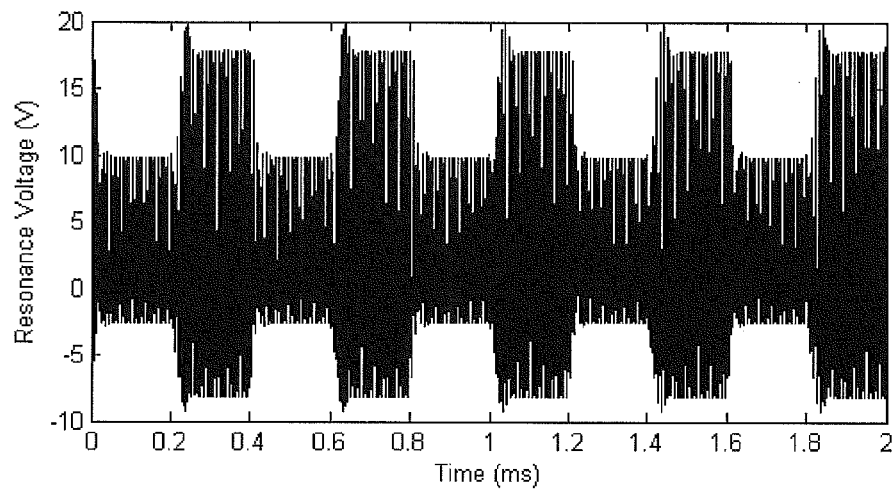
FIG. 16A is a waveform showing the resonance voltage in a tag with the feedback circuit switched on and the MOSFET gate voltage modulated at an increased rate.
Figure 16B:
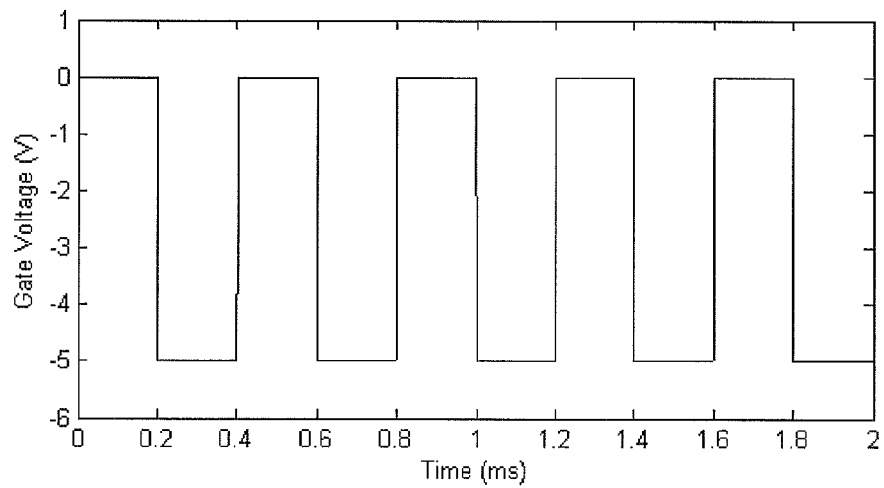
FIG. 16B is the corresponding gate voltage.
Figure 17A:
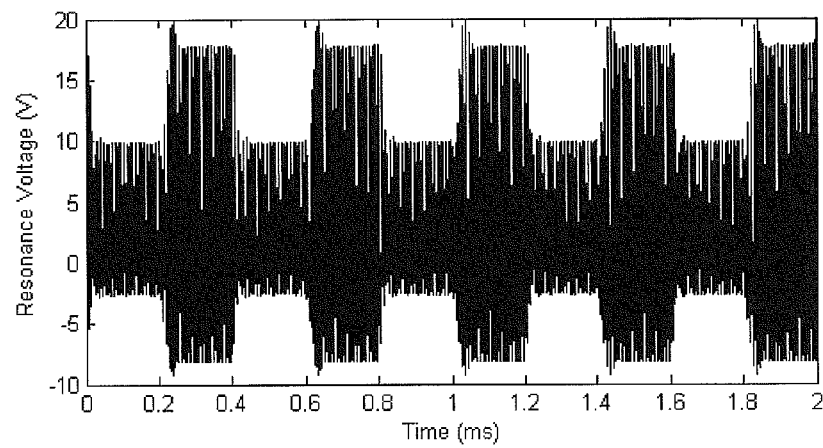
FIG. 17A is a waveform showing the resonance voltage in a tag with the feedback circuit switched on and the MOSFET gate voltage modulated at an increased rate.
Figure 17B:
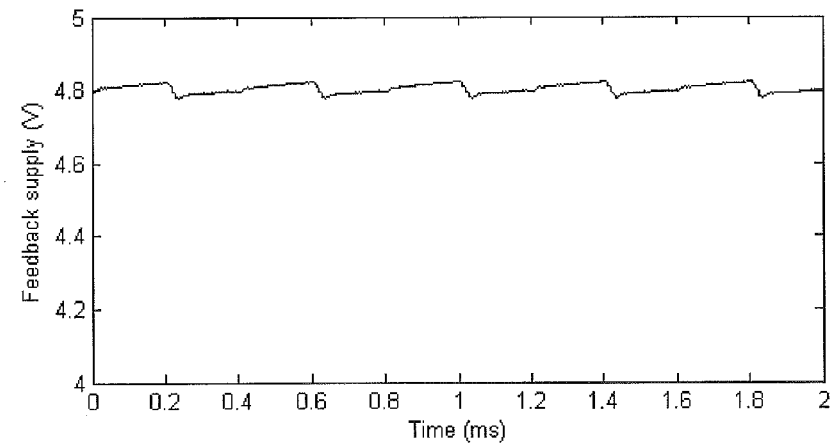
FIG. 17B is the corresponding feedback supply voltage.

FIGS. 16 and 17 show similar graphs but for a faster modulation rate, demonstrating the excellent performance of the feedback in achieving fast communication rates with the high Q antenna. Three principles are at work to achieve this performance as follows:

1) Feedback to reduce the amplitude of transient changes to the tag resonance voltage.
2) A local energy store on the tag that is continually charged by the resonance and used to augment the reader field to allow a fast transition in the tag resonance.
3) Recycling some of the energy from a high to low transition for later use in the augmentation of a low to high transition.

These principles may be applied in any combination to improve the performance of a tag. They may be applied to a self-adaptive resonator or a standard linear resonator.

The circuit employed in this embodiment uses a constant pulse width applied to the feedback MOSFETs. The feedback results from the transient current into capacitor C4 and a following current pulse from the feedback supply into the resonance through D1. Increases in amplitude are compensated with a reduced width of the current pulse, and a reduction in amplitude. There are alternative implementations of feedback that may be employed including any combination of the following:

1) A variable pulse width applied to the feedback MOSFETs, with the pulse width inversely related to the resonance amplitude.
2) A variable phase of the pulse applied to the feedback MOSFETs, with the pulse time brought forward in response to a transient increase in resonance amplitude.
3) Control over the energy input or output at the resonance voltage point. This may be combined with the continual energy being taken from the resonance at this point in order to run the tag. A transient increase in the resonance amplitude may lead to an increased level of power taken out of the resonance, reducing the transient amplitude. Likewise a transient decrease in the resonance amplitude may lead to a decreased level of power taken out of the resonance, reducing the transient amplitude. This method benefits from the fact that a continuous energy drain from the resonance is required to run the tag. As a result there may not be a requirement to take further energy out of the resonance only to re-introduce it with the feedback circuit. It therefore has the potential to be more efficient.
4) Control over the resonance MOSFET gate voltage.
5) Any other analogue or digital control over the self-adaptive resonator controls such that transient changes to the resonance are reduced.

The feedback employed in this embodiment uses a single pulse to the feedback MOSFETs per cycle. This may be reduced to a single pulse per two or more cycles of the resonance in order to conserve power dissipated in switching the MOSFETs.

Figure 18:
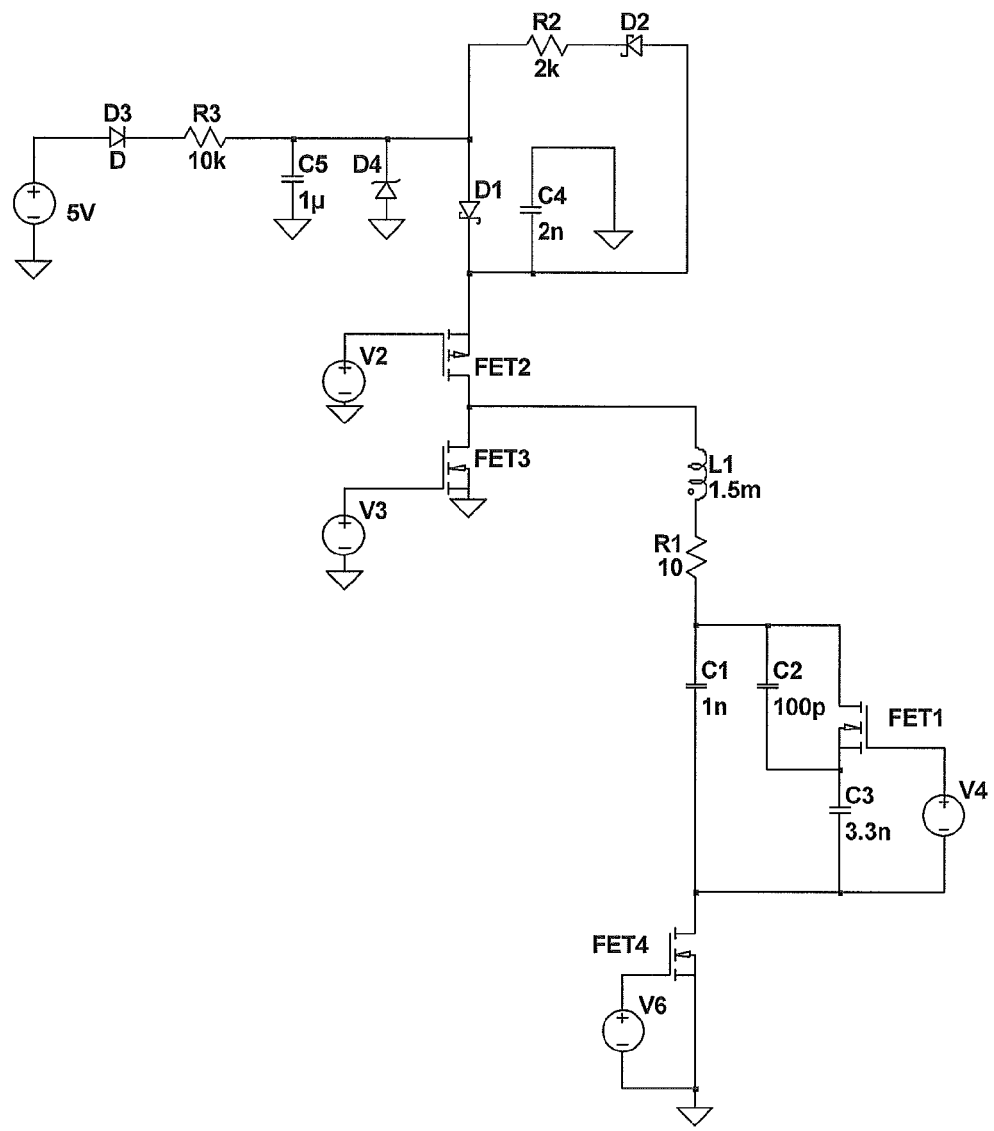
FIG. 18 is a schematic of an embodiment of a tag with a cut-off MOSFET that may be used to modulate the current in the resonator.
Figure 19A:
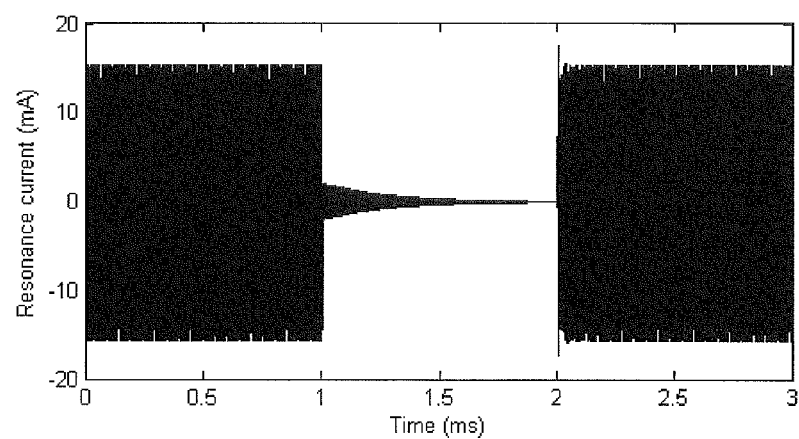
FIG. 19A is a waveform showing the current in the tag antenna in the presence of a reader field when the cut-off MOSFET is modulated.
Figure 19B:
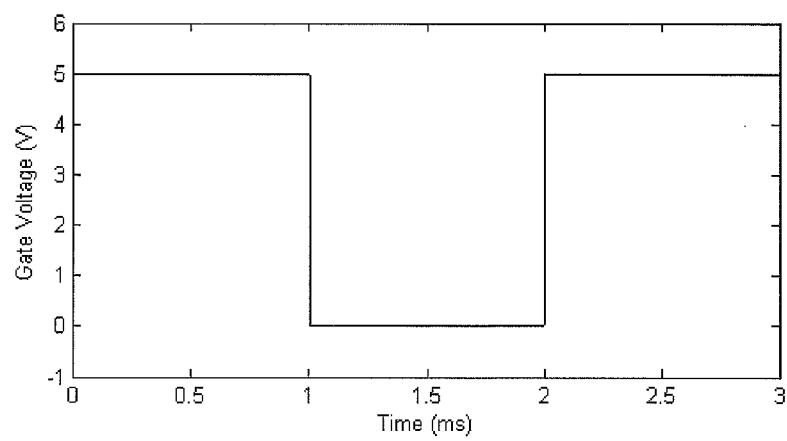
FIG. 19B is the corresponding gate voltage of the cut-off MOSFET.

FIG. 18 shows an embodiment of a tag that includes an additional MOSFET to turn off the current in the tag. This is used in order to achieve better recycling of energy in the tag for a high to low transition, and its subsequent recycling for a low to high transition. FIG. 19A shows the current in the tag antenna as a function of time and FIG. 19B shows the corresponding voltage on the cut-off MOSFET. At time 1 ms the MOSFET is turned off and the current in the antenna drops drastically. At the same point the modulation of the feedback MOSFETs is stopped, with the n-type MOSFET connecting the antenna to ground.

Figure 20A:
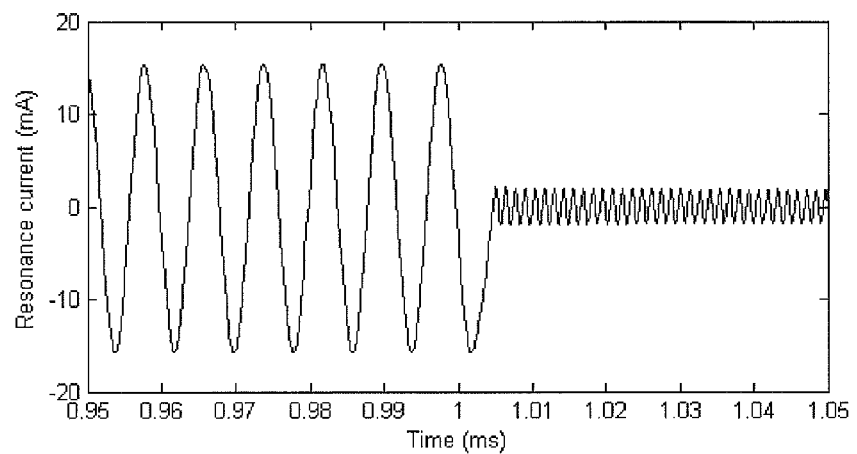
FIG. 20A is a zoomed graph of the tag antenna current and FIG. 20B is the corresponding gate voltage of the cut-off MOSFET.
Figure 20B:
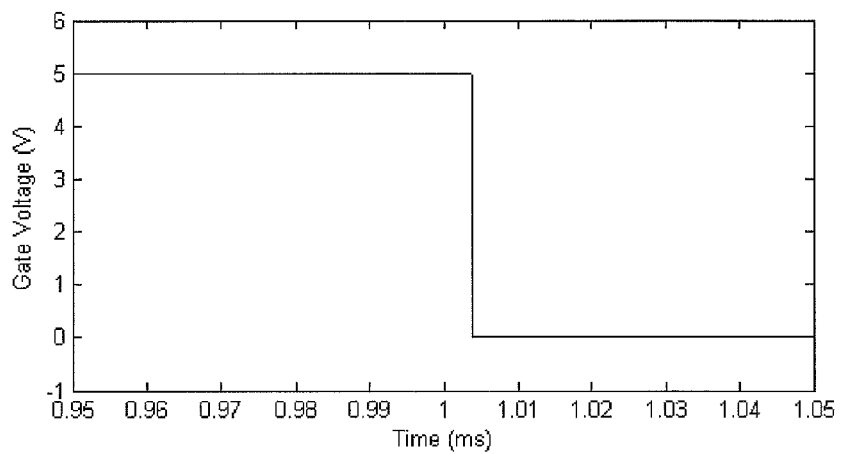

FIG. 20 shows a zoomed in graph of FIG. 19. The cut-off MOSFET is turned off near the end of the negative current portion of the waveform. The rest of this negative current portion completes with conduction through the MOSFET body diode. However, the MOSFET is now cut off for the positive current portion of the waveform and the current drops. The subsequent waveform is the oscillation of the resonator with the capacitance of the MOSFET; this is both much lower in amplitude and at a higher frequency.

Figure 21A:
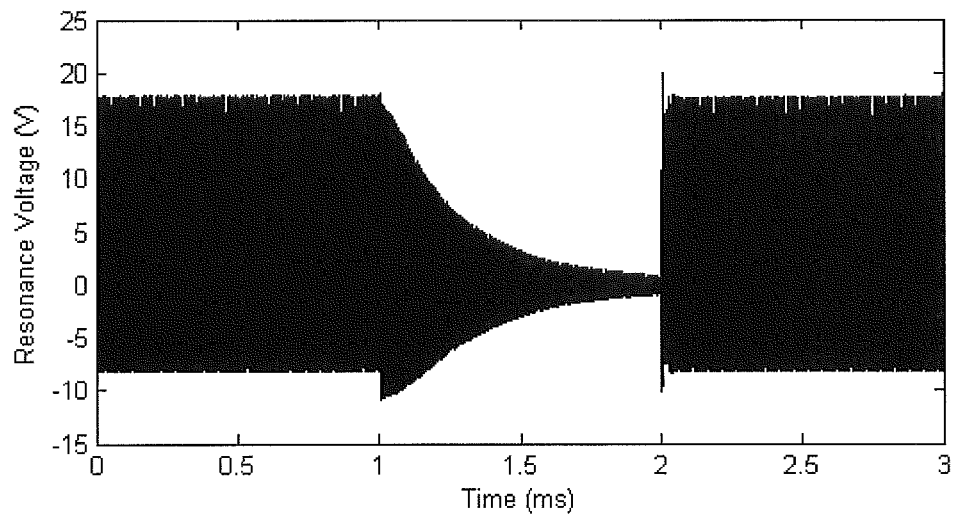
FIG. 21A is a waveform showing the resonance voltage when the cut-off MOSFET is modulated.
Figure 21B:
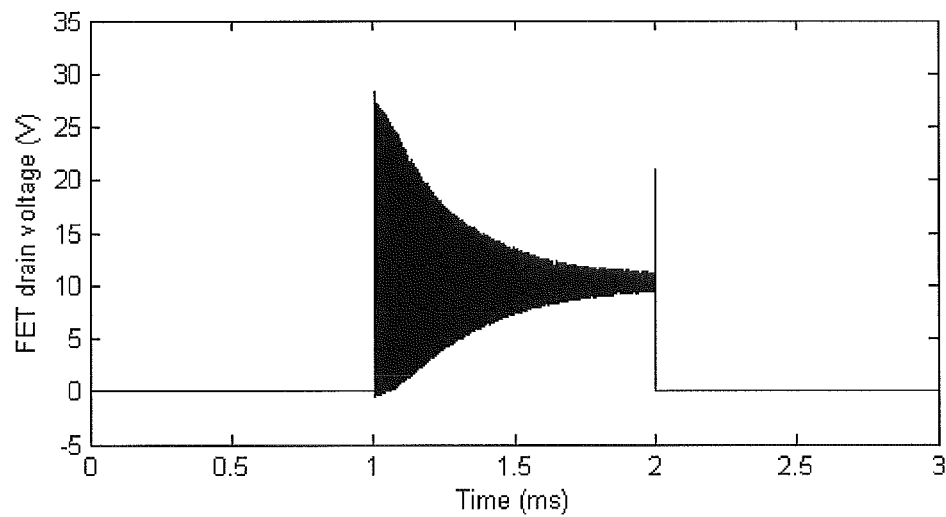
FIG. 21B is the voltage at the drain of the cut-off MOSFET.

FIG. 21 shows the resulting resonance voltage (FIG. 21A) and voltage at the drain of the cut-off MOSFET (FIG. 21B). When the MOSFET is cut off, the voltages do not drop to the same relative level that is evident in the graphs of current. The reason for this is the higher frequency of this oscillation, generating high voltages for the smaller energy in the resonator. These high frequency transient waveforms may not be a problem due to their lower energy content, however if they do interfere with normal operation of the reader they may be damped out. For example high frequency loss may be introduced or a limiting circuit switched in then the MOSFET is cut off.

When the MOSFET is turned off, there is a steady state voltage stored on the capacitors in the self-adaptive resonator in addition not the high frequency transient. This is clear in FIG. 21B as a jump of the MOSFET drain voltage from 0V to 10V. In this manner the current in the resonator may be stopped abruptly and the majority of the energy stored in the capacitors of the resonator. This embodiment demonstrates greater efficiency of recycling than the previous embodiment.

The resonance is re-started at 2 ms by turning the cut-off MOSFET back on and also re-starting the modulation of the feedback MOSFETs. The charge that was stored in the resonator capacitors is used to quickly re-start the resonator at its previous amplitude. Any additional energy required because of the losses associated with the high frequency transient are accommodated by the feedback circuit, which also prevents additional transients.

Figure 22:
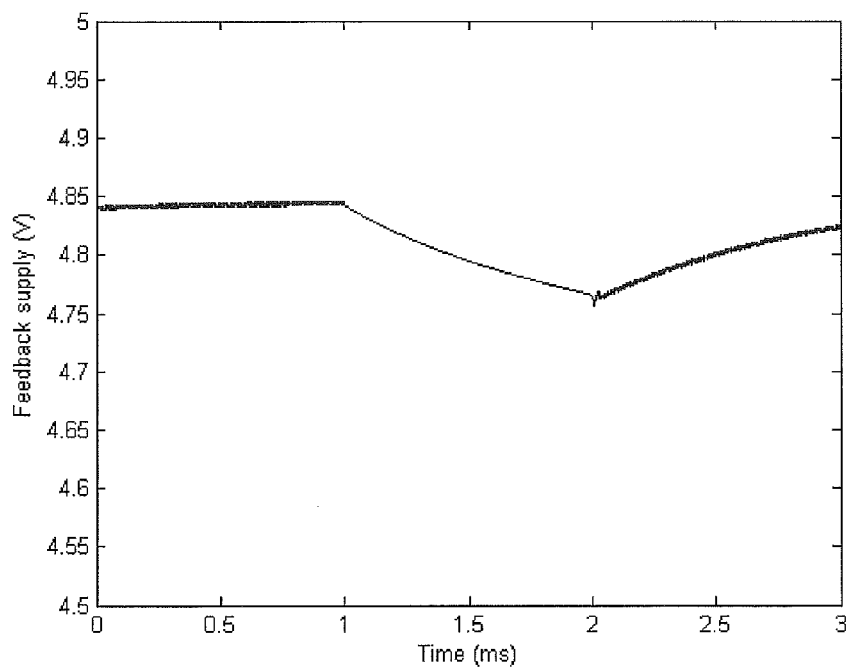
FIG. 22 is a waveform showing the feedback supply voltage when the cut-off MOSFET is modulated

FIG. 22 shows the feedback supply voltage as a function of time. When the cut-off MOSFET is turned off the feedback supply drops. The cause of this is current in the zener diode D4 bleeding charge away from the feedback supply C5. If this is a problem then a lower current voltage limiter may be used, or the voltage limiter switched out of the circuit when the cut-off MOSFET is turned off. In this example the feedback supply remains at a high enough voltage to keep D3 cut off and power the feedback. When the resonance is re-started at 2 ms the transient drop in the feedback voltage is very small. Most of the energy of the resonance was stored in the capacitors of the resonator and very little additional energy is required from the feedback. The feedback voltage subsequently rises gradually due to energy drawn from the high amplitude resonance.

This embodiment demonstrates how the energy in the tag resonator may be efficiently recycled over the course of the modulation. It is stored locally on the tag for a transition in one direction and re-used to augment the power available from the reader field for the opposite going transition. The difference with the previous embodiment is that most of the energy is stored from the transition, whereas the previous embodiment generates the augmenting energy continuously from multiple oscillations of the resonance.

There are many alternative scenarios for this recycling of energy in the tag from a single transition. Another alternative is to keep the feedback circuit operational but to transition the tag from a high amplitude state to a low amplitude state by extracting energy at the resonance voltage point. A switch, such as a MOSFET, is used to connect the resonance voltage point to the 5V feedback voltage store with low impedance. The resonance will charge the 5V store through the inductance, taking energy out of the resonance that may be re-used subsequently. At the same time the gate voltage of the resonance MOSFET, V4, may be transitioned to a new level. The operation of the feedback circuit will control any transients generated by this operation. The energy stored in the feedback circuit may be put back into the resonance for the opposite going tag transition. This is achieved through the level on the resonance MOSFET gate, V4.

These two embodiments have implemented modulation in the tag through the resonance gate voltage and by stopping the current in the resonance all together. In addition there are a number of alternative modulation methods that may be applied to the self-adaptive resonator controls. These include:
1) The width of the pulse used in the feedback may be modulated, resulting in a different resonance amplitude for a given gate voltage.
2) The phase of the pulse in the feedback may be modulated, which will modify the phase of the resonance. This will in turn modify the energy dissipated in the reader antenna, even if the amplitude in the tag stays constant.
3) The Q of the resonator may be modified by coupling an additional resistor into the circuit. This will change the energy drawn out of the reader field to maintain the same amplitude, which may be picked up in the reader.

Figure 23:
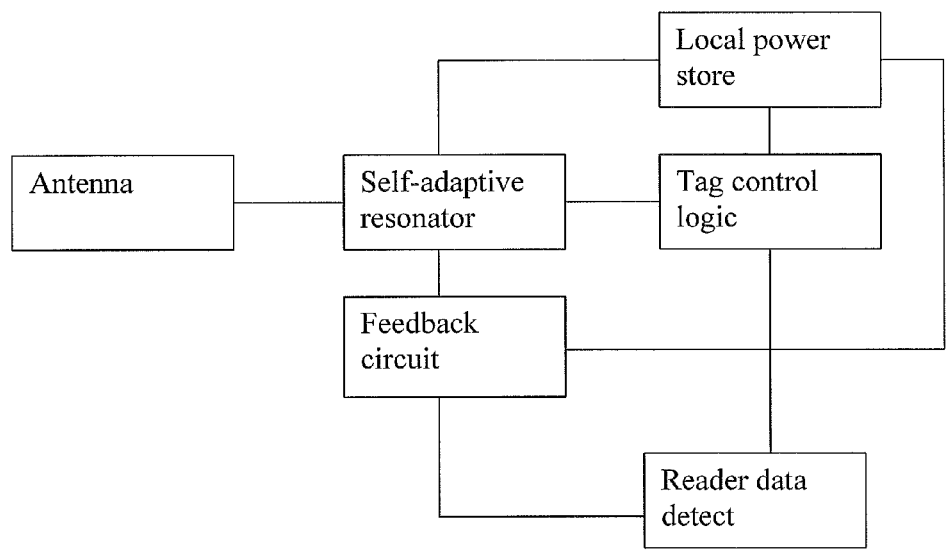
FIG. 23 is a block diagram of an embodiment of a tag incorporating a detector of the reader field modulation.

FIG. 23 shows a block diagram of an embodiment of a tag that may register data communicated by the reader to the tag through the amplitude of the reader field. The tag comprises a self-adaptive resonator that generates power for a local power store and to operate a feedback circuit, similar to previous embodiments. When the feedback is operational the resonator adjusts quickly to transient changes in the tag or reader. For communication from the reader to the tag, the reader field is modulated. This may be picked up in the tag through the level of feedback applied, as indicated in the block diagram. There are also alternative measurements that will detect the change in reader field strength including:
1) The resonance voltage.
2) The local power store.
3) The feedback supply voltage FIG. 24 shows waveforms that illustrate the operation of communication from the reader to the tag. The schematic employed in this embodiment is the same as FIG. 10. The resonance has been ramped up in the presence of a reader powering field and the feedback circuit turned on. The gate voltage on the MOSFET is kept at 0V.

Figure 24A:
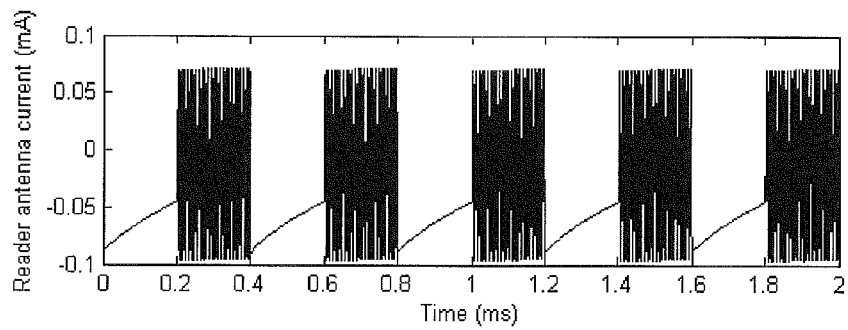
FIG. 24A is a waveform of a modulated reader field.
Figure 24B:
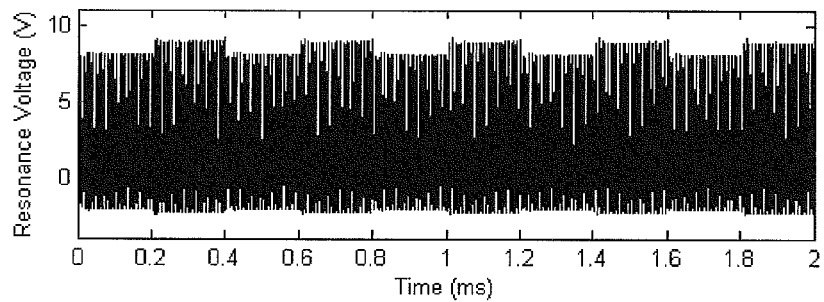
FIG. 24B is the corresponding resonance waveform in the tag and FIG. 24C is the transient voltage at the p-type source connection.

FIG. 24A shows the reader antenna current that is modulated with 0.2 ms on and 0.2 ms off. The resulting resonance voltage is shown in FIG. 24B, where a corresponding drop in amplitude is seen when the reader field is stopped. The change in resonance voltage is however quite small in comparison to the 100% change in the reader amplitude. This is because the feedback circuit maintains the amplitude of the resonance, drawing power from the feedback supply. Although this does reduce the amplitude of the change, the speed of response in the tag is now high and the resonance voltage follows the sharp change in the reader. This change may be registered by the tag, and the communication from the reader received.

Figure 24C:
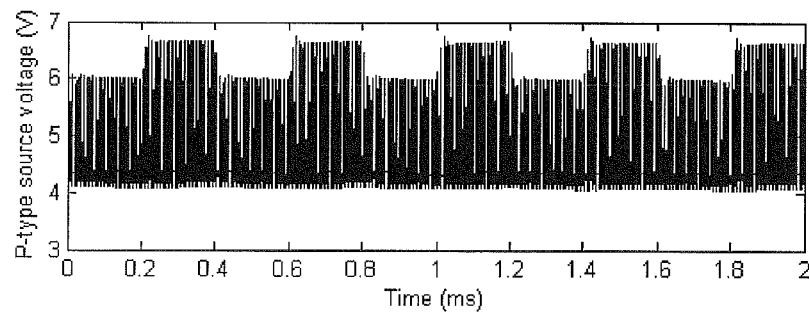

FIG. 24C shows the transient voltage at the source contact to the p-type MOSFET. When the reader field is switched off and the feedback circuit maintains the resonance amplitude, this transient voltage drops. This is an alternative point at which the communication from the reader may be registered.

Figure 25A:
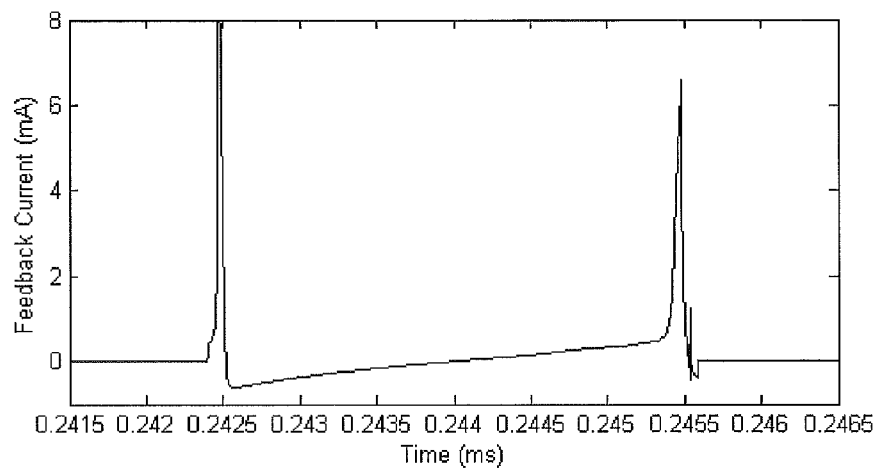
FIG. 25A is a waveform of the current supply to the resonance from the feedback circuit when the reader field is high.
Figure 25B:
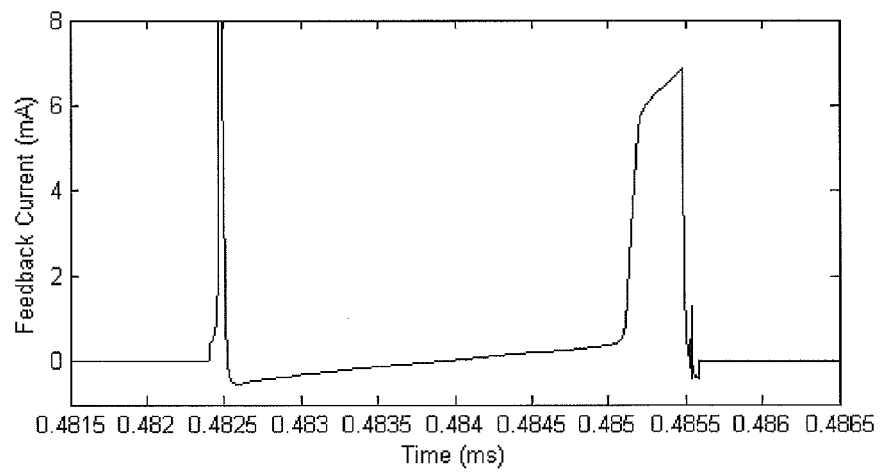
FIG. 25B is the corresponding waveform when the reader field is low.

FIG. 25 provides a further illustration of how the level of power supplied by the feedback circuit is modified by the presence or absence of the reader field. FIG. 25A shows the current supplied to the resonance through diode D1 when the reader field is high. The corresponding waveform when the reader is turned off is shown in FIG. 25B. The increase in current supplied by the feedback is clear as a widening of one of the current supply pulses. This pulse width may be monitored as an indicator of the level of feedback to register the communication from the reader.

Figure 26:
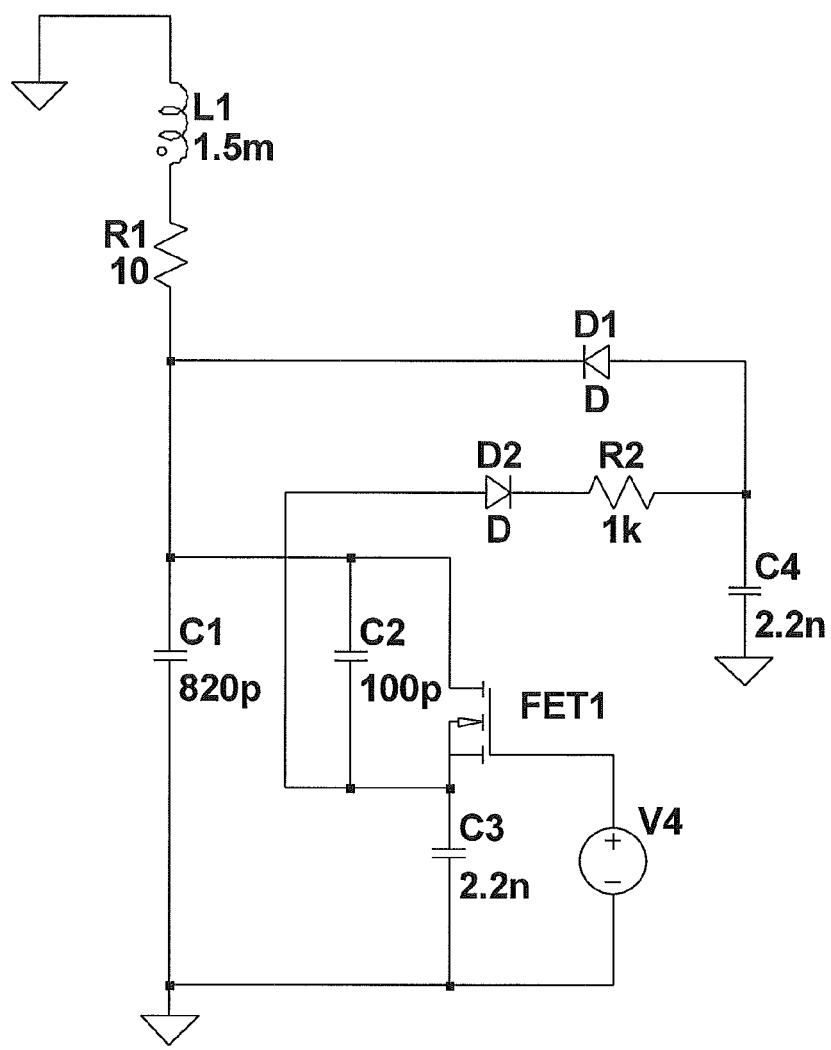
FIG. 26 is a schematic of an embodiment of a tag with a simplified feedback circuit.

An alternative feedback implementation is employed in the embodiment in FIG. 26. Here, rather than the use of a driver circuit, the feedback is implemented with two diodes, a resistor and a capacitor. The principle is that every cycle, C4 is charged to negative voltages through diode D1; D1 is connected to the point on the circuit that reaches the largest negative voltage. The charge on C4 is introduced back into the resonance onto C3 through diode D2 and resistor R2. The feedback network is continually taking energy out of the resonance and re-introducing it at a different point. There is some energy loss associated with this, due to the charge flowing through 1 kΩ when re-introduced onto C3, however this is small compared to the transient energy and the total system Q remains high.

The introduction of negative feedback by this network is clear when considering the response of the circuit to a transient increase or decrease in resonance amplitude. If the amplitude increases then additional energy is taken out of the resonance in order to charge C4 to the new amplitude. This increase is greater than any corresponding increase in the energy re-introduced into the resonance at C3. Therefore the action of the network is to oppose the transient increase in amplitude. If the amplitude decreases then the energy taken out of the resonance through C4 drops, whereas there will still be some energy re-introduced into the resonance at C3, due to the residual charge held on C4. Therefore the network also opposes a transient decrease in amplitude.

Figure 27A:
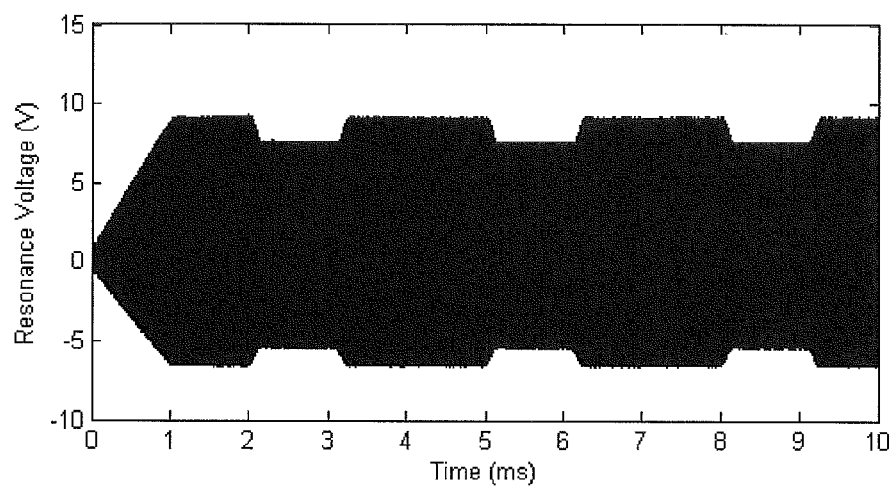
FIG. 27A is a waveform of the resonance voltage in the tag of FIG. 26, where Vgate is modulated as shown in FIG. 27B.
Figure 27B:
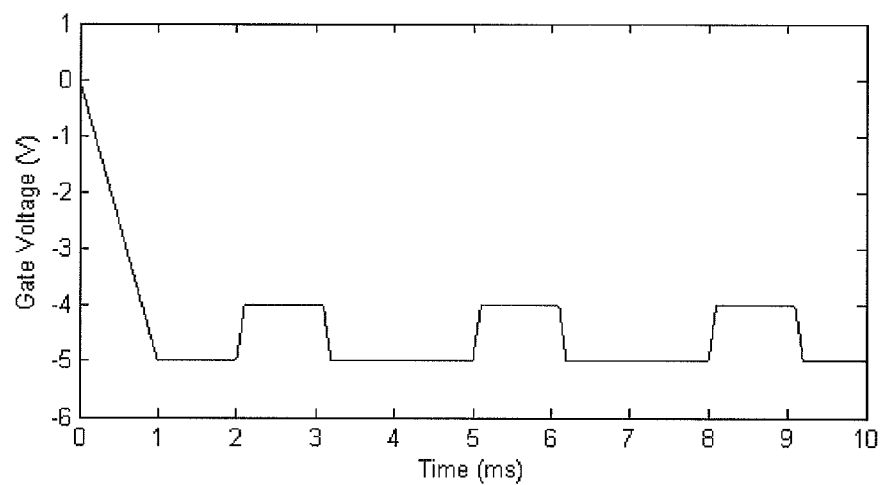

FIG. 27 shows the resonance voltage as a function of time where Vgate is modulated with the same profile as shown in FIG. 8. The resulting resonance behaviour is improved, with the transient ringing in the resonance amplitude eliminated by the negative feedback.

Figure 28:
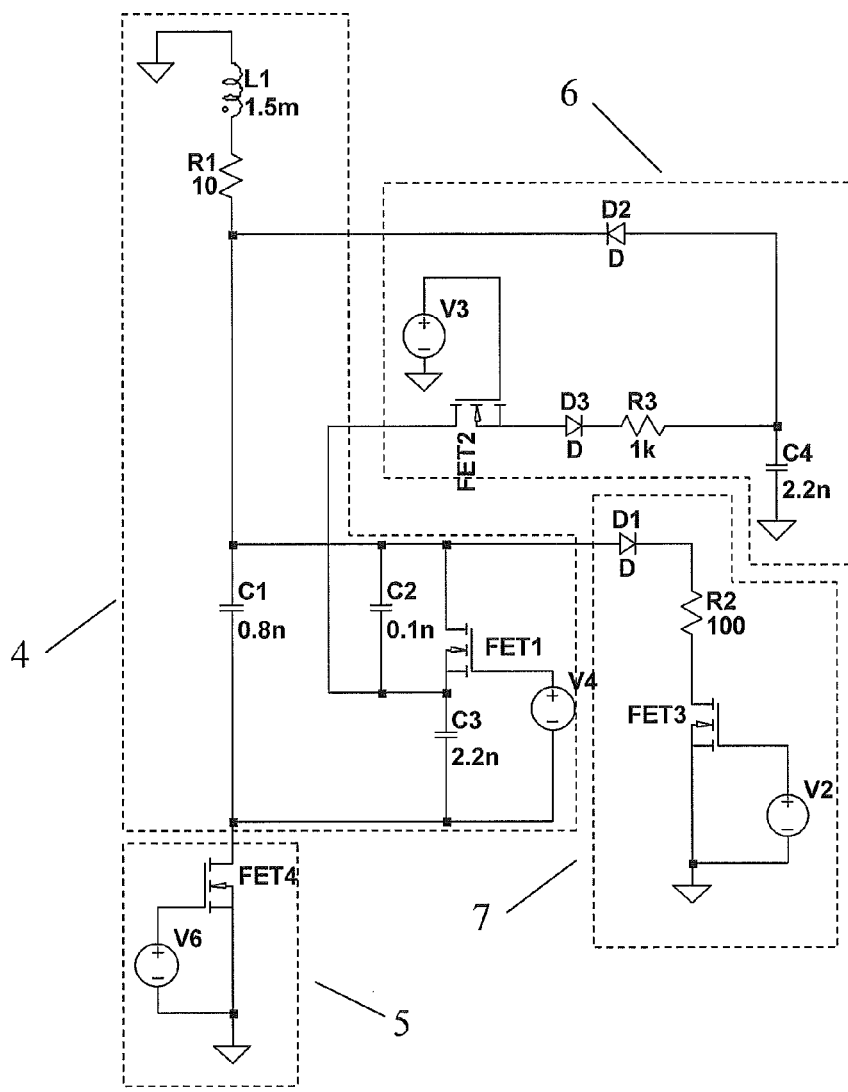
FIG. 28 is a schematic of an embodiment of a tag with a simplified feedback circuit and additional blocks for current cut off in the tag antenna and transient control.

FIG. 28 shows a further embodiment of a tag that uses the same feedback network as shown in FIG. 26. This embodiment comprises the resonance circuit 4, the MOSFET to cut off the current in the tag antenna with subsequent recycling of the resonant energy 5, the feedback network 6, and an additional block to control the transients generated at turn off. This circuit implements a high Q tag that has the capability for 100% modulation of the resonant amplitude and fast transition times. Operation of the circuit will now be described.

Figure 29A:
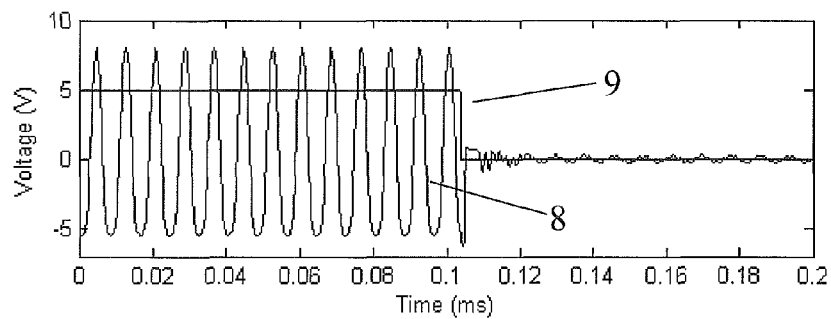
FIG. 29 is a set of waveforms illustrating the operation of the tag of FIG. 28 where the antenna current is cut off.
Figure 29B:
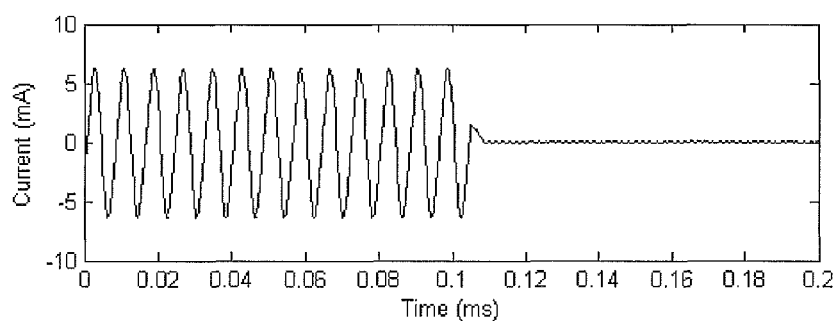
Figure 29C:
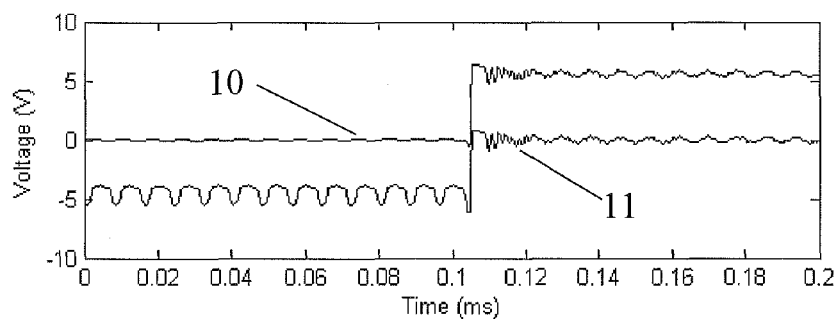

FIG. 29A shows the resonance voltage 8 together with the control voltage to the cut-off MOSFET. As before, the MOSFET is turned off when the current flow is negative, such that the completion of the cycle takes place through the body diode of this MOSFET. However, at this point control voltage V2 also turns on FET3 for a duration of 15 μs. Without the use of FET3 then a transient is generated when the antenna current is cut off and the resonance voltage oscillates at high frequency. However, now when the current is cut off and the resonance voltage jumps to a positive voltage, the energy in the transient is quickly dissipated in the conduction through the 1000 resistor in series with FET3. FET3 is then turned off when the transient has been controlled. The use of the transient control gives a much cleaner halt to the resonance than the original example shown in FIG. 21. This is further illustrated by the antenna current, shown in FIG. 29B.

FIG. 21C shows the voltage of at the drain of FET4 10, together with the voltage at the source of FET1, 11. The dc levels that result on the capacitive network store the potential energy of the resonance that can be subsequently used to quickly re-start the resonator. Note that the voltage on the source of FET1 jumps significantly higher than the negative voltage stored on C4. For this reason the MOSFET FET2 has been introduced in the feedback network to isolate the charge stored on C4 for the duration that the resonator current is off. The control voltage V3 jumps to the negative voltage rail when the current is turned off such that C4 is isolated.

Figure 30A:
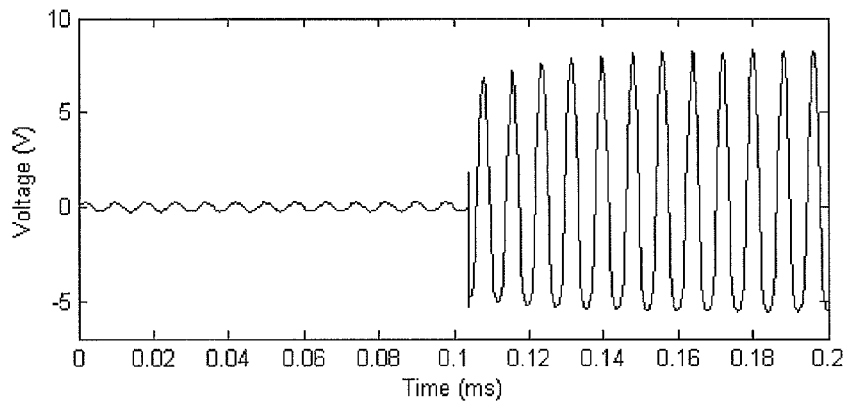
FIG. 30A shows the resonance voltage and FIG. 30B shows the antenna current when the tag oscillation is re-started.
Figure 30B:
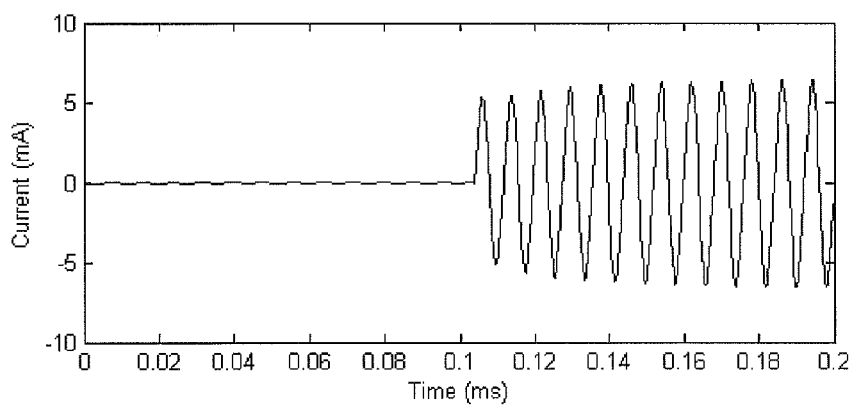
Figure 31:
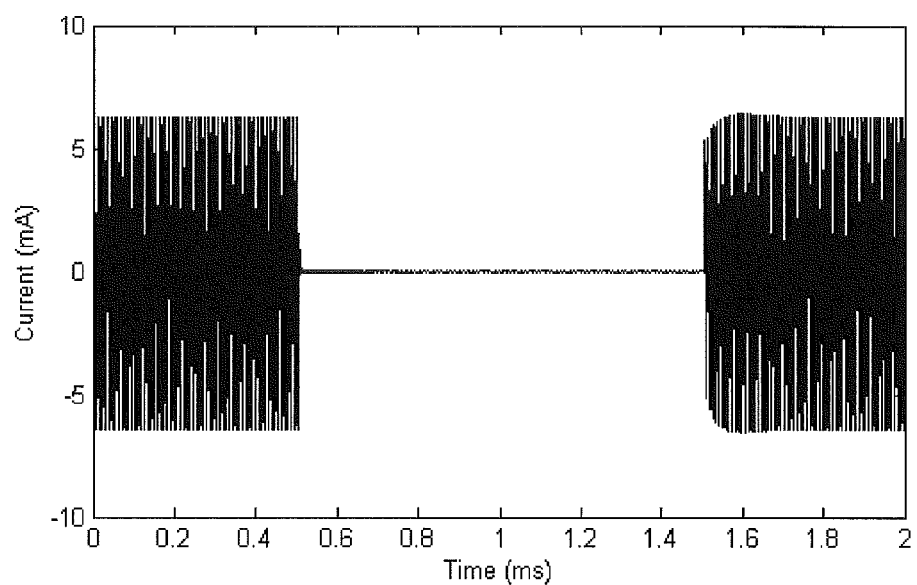
FIG. 31 shows the antenna current when it is both stopped and subsequently re-started.

The result of turn on is shown in FIG. 30. At turn on FET4 is switched on to allow the antenna current to flow and FET2 is switched on to couple in the feedback network. The resulting antenna voltage and current are shown in FIGS. 30A and 30B, respectively. The antenna current starts sharply, with an amplitude slightly below the stop amplitude. This then rises smoothly over the next 5 cycles to the steady state amplitude. The smooth stop and start of the tag antenna current is shown over a wider timescale in FIG. 31, illustrating the lack of any significant artefacts.

In summary the use of feedback to minimise transient changes in the resonance voltage provides a tag that may have high Q behaviour on the timescale of a slowly varying powering field, together with a fast response to communication from the reader to the tag and tag to the reader.

It is noted here that although the discussion of the use of feedback and a local energy store has focussed on the use of the self-adaptive resonator, these principles may equally well be applied to a conventional linear resonator. Such an implementation may be combined with a self-adaptive resonator for an initial powering cycle, switching to the linear resonator once sufficient power is obtained. The tag may also run a tuning circuit to ensure the high Q linear resonator remains at the same frequency as the powering field. The feedback circuit and the local energy store applied to the linear resonator facilitate communication between the reader and the tag, whilst keeping the high Q behaviour for the slowly varying powering field.

The use of the self-adaptive resonator, possibly in combination with a tuning circuit once the tag is powered, not only improves the tolerance to detuning of the tag but also may allow use of the same tag with multiple frequencies. Examples include a low frequency tag operating at the two common low frequencies of 125 kHz and 134 kHz or an ultra high frequency tag operating over the band 860 MHz to 960 MHz. Here the self-adaptive resonator is able to power up the tag across the range of required frequencies, then operating the same resonator or a conventional resonator with a powered tuning circuit for subsequent communication.

The embodiments outlined here provide for an improved RFID tag that has increased tolerance to detuning and/or greater range. Alternatively the tag may be made smaller for the same range. A further benefit may be to allow higher amplitude modulation in the tag than may be obtained with a conventional tag with a lower Q under similar circumstances. Such an increase in modulation amplitude will make the system more tolerant to electromagnetic noise, which can be the limiting factor in system performance.

The 125 kHz frequency band chosen for the embodiments is purely by way of example. Applications of the invention are not limited to frequencies around this band, and extend to include all frequencies ranging from sub-sonic to microwave frequencies and beyond. More specifically to RFID, all common RFID frequency bands are included, such as 125 kHz, 134 kHz, 13.56 MHz, 869 MHz, 915 MHz, and the like.

No doubt many other effective alternatives will occur to the skilled person. It will be understood that the invention is not limited to the described embodiments and encompasses modifications apparent to those skilled in the art lying within the spirit and scope of the claims appended hereto.

I claim:

1. A full-duplex RF tag for sending data to a tag reader by load modulation of an RF field of said tag reader, the tag comprising:
    an antenna to couple to said RF field of said tag reader;
    a resonant circuit coupled to said antenna to resonate at a frequency of said RF field with a resonance amplitude;
    a local power store to store power extracted from said RF field;
    a modulation system to provide said load modulation by modulating one or both of said resonance amplitude and a relative phase of a signal in said resonant circuit with respect to said RF field; and
    a feedback circuit coupled to said resonant circuit and to said local power store to control one or both of said resonance amplitude and said relative phase to control transients in said resonance amplitude caused by said modulating to provide said load modulation, wherein
    said feedback circuit is arranged to draw power from the resonant circuit and store the drawn power in said local power store during said load modulation, said drawing of power to control a first modulation transition of said resonance, and is further arranged to draw power from said local power store during said load modulation to control a second, opposite-going modulation transition of said resonance, wherein said first and second modulation transitions are for said load modulation and are each between two data states of said modulating.

2. A full-duplex RF tag as claimed in claim 1 further comprising a resonant circuit control system coupled to said local power store and to said resonant circuit to control said resonant circuit, and wherein said feedback circuit is further coupled to said resonant circuit control system.

3. A full-duplex RF tag as claimed in claim 2 wherein said resonant circuit control system comprises a resonant circuit driver to drive said resonant circuit substantially at a frequency of said RF field.

4. A full-duplex RF tag as claimed in claim 3 further comprising an oscillator or phase locked loop coupled to said resonant circuit and to said driver to control a timing of said drive for said resonant circuit.

5. A full-duplex RF tag as claimed in claim 3 wherein said driver comprises a pair of transistors in a push-pull configuration.

6. A full-duplex RF tag as claimed in claim 1 wherein said feedback circuit is configured to control power taken out of said resonance to provide feedback to control said transients.

7. A full-duplex RF tag as claimed in claim 1 wherein said local power store comprises a capacitor or inductor, and said feedback circuit comprises a circuit coupled between said resonant circuit and said capacitor or inductor to extract energy from said resonant circuit in one cycle of said resonance and to store said extracted energy in said capacitor or inductor and to deliver energy from said capacitor or inductor to said resonant circuit during one or more subsequent cycles of said resonance.

8. A full-duplex RF tag as claimed in claim 7 wherein said feedback circuit includes at least one of a semiconductor device and rectifier coupled between said resonant circuit and at least one of said capacitor and inductor.

9. A full-duplex RF tag as claimed in claim 7 wherein said feedback circuit includes two connections to said resonant circuit, a first connection to extract said energy and a second connection to deliver said energy.

10. A full-duplex RF tag as claimed in claim 9 wherein said resonant circuit includes a nonlinear element, and wherein one of said connections comprises a connection to said nonlinear element.

11. A full-duplex RF tag as claimed in claim 1 where said feedback circuit comprises a diode series coupled to a voltage source and a capacitor connected across said combination of said diode and said voltage source, said capacitor being coupled to said resonant circuit and to said resonant circuit control system.

12. A full-duplex RF tag as claimed in claim 11
further comprising a resonant circuit control system coupled to said local power store and to said resonant circuit to control said resonant circuit;
wherein said feedback circuit is further coupled to said resonant circuit control system;
wherein said resonant circuit control system comprises a resonant circuit driver to drive said resonant circuit substantially at a frequency of said RF field; and
wherein said capacitor is coupled to said resonant circuit via said resonant circuit driver.

13. A full-duplex RF tag as claimed in claim 1, wherein said feedback circuit is configured to control one or more of: a drive frequency of said driver circuit, a relative drive phase of said driver circuit and said signal in said resonant circuit, a drive duty cycle of said driver circuit, an energy drawn from said resonant circuit, an energy input to said resonant circuit, a value of a resonant element of said resonant circuit, and a control signal to an element of said resonant circuit.

14. A full-duplex RF tag as claimed in claim 1 wherein said resonant circuit comprises a nonlinear resonant circuit.

15. A full-duplex RF tag as claimed in claim 14 wherein said resonant circuit comprises an inductor coupled to a first capacitor to form a resonant circuit, the resonator further comprising a controllable element, a second capacitor controllably coupled across said first capacitor by said controllable element, and a control device to control said controllable element such that a total effective capacitance of said first and second capacitor varies over a duty cycle of an oscillatory signal in said resonator.

16. A full-duplex RF tag as claimed in claim 15 wherein said modulation system comprises a control connection to said controllable element.

17. A full-duplex RF tag as claimed in claim 15 wherein said controllable element comprises a transistor and wherein said control device comprises a bias circuit for said transistor.

18. A full-duplex RF tag as claimed in claim 1 comprising a circuit to extract energy from said RF field using said resonant circuit, coupled between said resonant circuit and said local power store.

19. A full-duplex RF tag as claimed in claim 18 further comprising a resonant circuit control system coupled to said local power store and to said resonant circuit to control said resonant circuit;
wherein said feedback circuit is further coupled to said resonant circuit control system;
wherein said resonant circuit control system comprises a resonant circuit driver to drive said resonant circuit substantially at a frequency of said RF field; and
wherein said circuit to extract energy from said RF field is coupled to said resonant circuit via said driver circuit.

20. A full-duplex RF tag as claimed in claim 1 wherein said resonant circuit comprises a linear resonant circuit.

21. A full-duplex RF tag as claimed in claim 1 wherein said modulating to provide said load modulation comprises amplitude modulation, the tag further comprising a system to use said local power source to assist an increase in said resonance amplitude during said amplitude modulation.

22. A full-duplex RF tag as claimed in claim 21 wherein said system includes said feedback circuit.

23. A full-duplex RF tag as claimed in claim 1 wherein said modulating to provide said load modulation comprises amplitude modulation, and wherein said resonant circuit includes one or more resonant capacitors, and wherein said tag includes a switch in said resonant circuit to store energy as a voltage on said one or more resonant capacitors to assist an increase in said resonance amplitude during said amplitude modulation.

24. A full-duplex RF tag as claimed in claim 23 further comprising a damping circuit coupled to said resonant circuit to dampen transients from switching of said switch, and wherein said damping circuit is switched in synchronism with said switch such that said damping circuit is active when said switch is operated to store said energy.

25. A full-duplex RF tag for receiving data from a tag reader modulating an RF field, the RF tag comprising:
an antenna to couple to said RF field of said tag reader;
a resonant circuit coupled to said antenna to resonate at a frequency of said RF field with a resonance amplitude;
a local power store to store power extracted from said RF field;
a feedback circuit coupled to said resonant circuit and to said local power store to control one or both of said resonance amplitude and said relative phase to control transients in said resonance amplitude caused by said modulation by said tag reader; and
an output from one or both of said resonant circuit and said feedback circuit to output a signal dependent on said data modulating said RF field, wherein
said feedback circuit is arranged to draw power from the resonant circuit and store the drawn power in said local power store during said modulation, said drawing of power to control a first modulation transition of said resonance, and is further arranged to draw power from said local power store during said modulation to control a second, opposite-going modulation transition of said resonance, wherein said first and second modulation transitions are each between two data states of said modulating.

26. A full-duplex RF tag as claimed in claim 25 further comprising a resonant circuit control system coupled to said local power store and to said resonant circuit to control said resonant circuit, and wherein said feedback circuit is coupled to said resonant circuit control system.

27. A full-duplex RF tag for sending data to a tag reader by load modulation of an RF field of said tag reader, the tag comprising:
an antenna to couple to said RF field of said tag reader;
a resonant circuit coupled to said antenna to resonate at a frequency of said RF field with a resonance amplitude;
a local power store to store power extracted from said RF field;

a modulation system to provide said load modulation by modulating one or both of said resonance amplitude and a relative phase of a signal in said resonant circuit with respect to said RF field; and wherein said modulating comprises amplitude modulation; and wherein said tag further comprises a system to use said local power store to assist an increase in said resonance amplitude during said amplitude modulation, wherein said feedback circuit is arranged to draw power from the resonant circuit and store the drawn power in said local power store during said load modulation, said drawing of power to control a first modulation transition of said resonance, and is further arranged to draw power from said local power store during said load modulation to control a second, opposite-going modulation transition of said resonance, wherein said first and second modulation transitions are for said load modulation and are each between two data states of said modulating.

28. A full-duplex RF tag as claimed in claim 27 wherein said resonant circuit includes one or more resonant capacitors and wherein said system includes a switch in said resonant circuit to store energy for said increase in amplitude as a voltage on said one or more resonant capacitors.

29. A full-duplex RF tag as claimed in claim 28 further comprising a damping circuit coupled to said resonant circuit to dampen transients from switching of said switch, and wherein said damping circuit is switched in synchronism with said switch such that said damping circuit is active when said switch is operated to store said energy.

30. A full-duplex RF tag as claimed in claim 28 further comprising an oscillator synchronized to a resonant signal of said resonant circuit to control said switch.

31. A full-duplex RF tag as claimed in claim 27 further comprising a resonant circuit control system coupled to said local power store and to said resonant circuit to control said resonant circuit.

32. A full-duplex RF tag as claimed in claim 27 wherein said system includes a feedback circuit, wherein said local power store comprises at least one of a capacitor and inductor, and said feedback circuit comprises a circuit coupled between said resonant circuit and said capacitor or inductor to extract energy from said resonant circuit in one cycle of said resonance and to store said extracted energy in said capacitor or inductor and to deliver energy from said capacitor or inductor to said resonant circuit during one or more subsequent cycles of said resonance.

33. A full duplex RF tag for load modulating an RF field to provide a modulated data return to a tag reader, said tag comprising a resonant circuit including at least one capacitor, and wherein said resonant circuit includes a resonance regeneration system such that during amplitude modulation of a resonant signal in said resonant circuit, when an amplitude of said resonant signal is reduced energy from said reduction is stored to control a first modulation transition of said resonance and when said amplitude is increased said stored energy is used to regenerate said resonant signal to control a second, opposite-going modulation transition of said resonance, wherein said first and second modulation transitions are each between two data states of said load modulating.

34. A full-duplex RF tag as claimed in claim 33 wherein said resonance regeneration system comprises a switch in series with said at least one capacitor, and an oscillator synchronized to said resonant signal to control said switch.

35. A full-duplex RF tag as claimed in claim 33 further comprising a transient control system to dissipate energy not stored by said resonance regeneration system.

36. A full-duplex RF tag as claimed in claim 35 wherein said transient control system comprises a switch coupled to an energy dissipating device, and an oscillator synchronized to said resonant signal to control said switch.

37. A full-duplex RF tag as claimed in claim 36, wherein said resonance regeneration system comprises a switch in series with said at least one capacitor, and an oscillator synchronized to said resonant signal to control said switch and wherein said switch of said resonance regeneration system and said switch of said transient control system are controlled in synchronism such that when said resonance regeneration system is acting to store energy said transient control system is acting to dissipate energy and when said resonance regeneration system is acting to regenerate said resonant signal said transient control system is not substantially dissipating energy.

38. A full-duplex RF tag as claimed in claim 37 wherein said switch of said resonance regeneration system and said switch of said transient control system each comprise an FET.

39. A full-duplex RF tag as claimed in claim 33 wherein said RF tag is a passive RF tag.

40. A full-duplex RF tag as claimed in claim 1 wherein said feedback circuit is arranged to perform said drawing of power and storage into said local power store and said power drawing from said local power store during a period between consecutive opposite-going transitions of said modulation to provide said load modulation, wherein each of said transitions is between two data states of said modulating.

41. A full-duplex RF tag as claimed in claim 1 wherein said feedback circuit is arranged to perform said drawing of power and storage into said local power store and power drawing from said power store during a single cycle of the resonance.

42. A full-duplex RF tag as claimed in claim 1 wherein said feedback circuit is arranged to extract a net amount of energy from the resonance for a transition of said modulating to provide said load modulation, said transition from a low data state of said modulating to a high data state of said modulating.

43. A full-duplex RF tag as claimed in claim 1 wherein said feedback circuit is arranged to draw a net amount of energy from the local power store during a transition of said modulating to provide said load modulation, said transition from a low data state of said modulating to a high data state of said modulating.

* * * * *